US012772580B2

(12) United States Patent
Shinohara

(10) Patent No.: US 12,772,580 B2
(45) Date of Patent: Oct. 20, 2026

(54) PHOTOELECTRIC CONVERSION ELEMENT AND PHOTOELECTRIC CONVERSION DEVICE

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 365 days.

(21) Appl. No.: 18/411,458

(22) Filed: Jan. 12, 2024

(65) Prior Publication Data

US 2024/0243157 A1 Jul. 18, 2024

(30) Foreign Application Priority Data

Jan. 18, 2023 (JP) ................................ 2023-005910

(51) Int. Cl.
*H01L 31/107* (2006.01)
*H10F 30/225* (2025.01)
(Continued)

(52) U.S. Cl.
CPC ........... *H10F 39/18* (2025.01); *H10F 30/225* (2025.01); *H10F 39/8023* (2025.01); *H10F 39/811* (2025.01)

(58) Field of Classification Search
CPC .... H10F 30/225; H10F 30/2255; H10F 39/18; H10F 39/8023; H10F 39/811; H10F 77/14
See application file for complete search history.

(56) References Cited

U.S. PATENT DOCUMENTS 7,394,492 B2 7/2008 Shinohara
7,741,593 B2 6/2010 Iwata
(Continued)

FOREIGN PATENT DOCUMENTS

JP 2020-57651 A 4/2020
WO 2022/244384 A 11/2022

OTHER PUBLICATIONS

Japanese Office Action issued Jun. 23, 2026 during prosecution of corresponding Japanese application No. 2023-005910. (English-language machine translation included.).

*Primary Examiner* — Jaehwan Oh
(74) *Attorney, Agent, or Firm* — VENABLE LLP

(57) ABSTRACT

A photoelectric conversion element is provided in a semiconductor layer having a first and second surfaces and includes a first semiconductor region of a first conductivity type in contact with the first surface, a second semiconductor region of a second conductivity type disposed closer to the second surface than the first semiconductor region, and a third semiconductor region disposed closer to the second surface than the second semiconductor region. The first and second semiconductor regions constitute an avalanche photodiode configured to multiply signal charges generated in the third semiconductor region. A distance between a boundary surface on a side of the second semiconductor region of the first semiconductor region and a boundary surface on a side of the first semiconductor region of the second semiconductor region is minimum in a first portion, and is wider in a second portion different from the first portion than in the first portion.

21 Claims, 21 Drawing Sheets

(51) Int. Cl.
*H10F 39/00* (2025.01)
*H10F 39/18* (2025.01)

(56) References Cited

U.S. PATENT DOCUMENTS

| | | | | |
|---|---|---|---|---|
| 7,821,551 | B2 | 10/2010 | Shinohara | |
| 7,884,870 | B2 | 2/2011 | Shinohara | |
| 8,139,133 | B2 | 3/2012 | Iwane | |
| 8,164,668 | B2 | 4/2012 | Iida | |
| 8,345,137 | B2 | 1/2013 | Shinohara | |
| 8,350,942 | B2 | 1/2013 | Shinohara | |
| 8,471,942 | B2 | 6/2013 | Shinohara | |
| 8,896,734 | B2 | 11/2014 | Shinohara | |
| 8,970,769 | B2 | 3/2015 | Shinohara | |
| 9,437,647 | B2 | 9/2016 | Shinohara | |
| 10,535,688 | B2 | 1/2020 | Onuki | |
| 10,714,515 | B2 | 7/2020 | Shinohara | |
| 10,771,720 | B2 | 9/2020 | Shinohara | |
| 10,818,724 | B2 | 10/2020 | Shinohara | |
| 10,944,931 | B2 | 3/2021 | Shinohara | |
| 11,056,520 | B2 | 7/2021 | Onuki | |
| 11,503,234 | B2 | 11/2022 | Shinohara | |
| 11,553,149 | B2 | 1/2023 | Shinohara | |
| 11,626,431 | B2 | 4/2023 | Shinohara | |
| 11,728,358 | B2 | 8/2023 | Shinohara | |
| 2006/0273421 | A1 | 12/2006 | Yasuoka et al. | |
| 2011/0234868 | A1 * | 9/2011 | Yamashita ............ | H10F 39/199<br>257/E27.128 |
| 2017/0084773 | A1 | 3/2017 | Piccione | |
| 2017/0229599 | A1 | 8/2017 | Sakata et al. | |
| 2020/0259038 | A1 | 8/2020 | Natsuaki et al. | |
| 2023/0038959 | A1 | 2/2023 | Sekine | |
| 2023/0420475 | A1 | 12/2023 | Shinohara | |
| 2023/0421919 | A1 | 12/2023 | Shinohara | |
| 2024/0035885 | A1 | 2/2024 | Shinohara | |

* cited by examiner

PHOTOELECTRIC CONVERSION ELEMENT AND PHOTOELECTRIC CONVERSION DEVICE

BACKGROUND OF THE INVENTION

Field of the Invention

The present invention relates to a photoelectric conversion element and a photoelectric conversion device.

Description of the Related Art

A single photon avalanche diode (SPAD) is known as a detector capable of detecting weak light at a single photon level. The SPAD multiplies signal charges excited by a photon by several times to several million times through avalanche multiplication phenomenon generated by a strong electric field induced in a p-n junction portion of a semiconductor. By converting a current generated by the avalanche multiplication phenomenon into a pulse signal and counting the number of pulse signals, the number of incident photons can be directly measured. Japanese Patent Application Laid-Open No. 2020-057651 discloses a photodetection device using SPAD and a photodetection system.

Japanese Patent Application Laid-Open No. 2020-057651 discloses a configuration in which a semiconductor region having a low impurity density is disposed between a cathode and an anode to increase electric field intensity between the cathode and the anode from the viewpoint of suppressing an increase in operating voltage and reducing noise. However, in the configuration described in Japanese Patent Application Laid-Open No. 2020-057651, the intensity of the electric field between the cathode and the anode can be increased to suppress an increase in the operating voltage, but a dark current, which is a noise component, may be generated in the strong electric field region of the peripheral portion of the cathode that deviates from the movement path of the signal charge.

SUMMARY OF THE INVENTION

According to an embodiment of the present disclosure, there is provided a photoelectric conversion element provided in a semiconductor layer including a first surface and a second surface opposed to the first face including a first semiconductor region of a first conductivity type disposed in contact with the first surface, a second semiconductor region of a second conductivity type disposed closer to the second surface than the first semiconductor region, and a third semiconductor region disposed closer to the second surface than the second semiconductor region, wherein the first semiconductor region and the second semiconductor region constitute an avalanche photodiode, and the avalanche photodiode is configured to multiply a signal charge generated in the third semiconductor region, and wherein a distance between a boundary surface on a side of the second semiconductor region of the first semiconductor region and a boundary surface on a side of the first semiconductor region of the second semiconductor region is minimum at a first portion positioned at a center portion of the first semiconductor region in a plan view, and the distance at a second portion different from the first portion is wider than the distance at the first portion.

Further features of the present invention will become apparent from the following description of exemplary embodiments with reference to the attached drawings.

DESCRIPTION OF THE EMBODIMENTS

Figure 1:
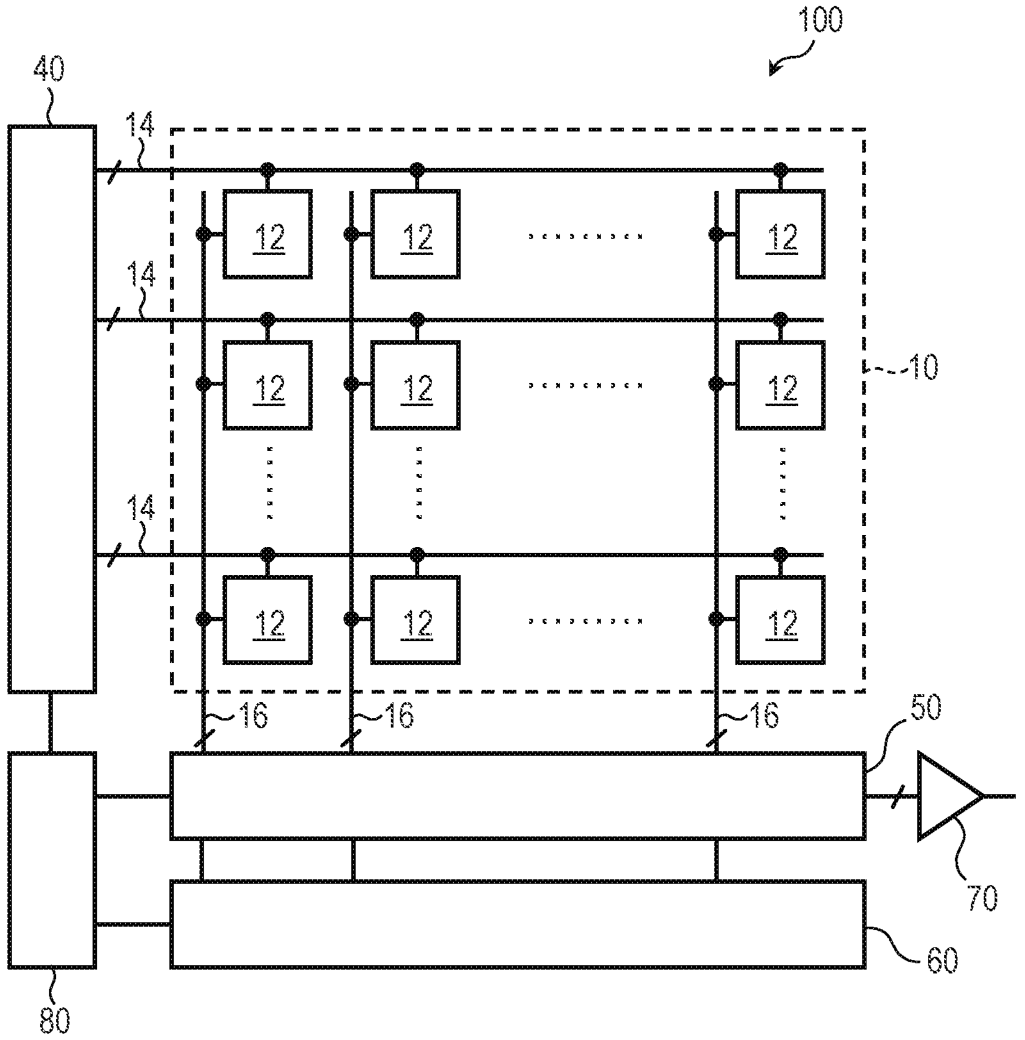
FIG. 1 and FIG. 2 are block diagrams illustrating a schematic configuration of a photoelectric conversion device according to a first embodiment of the present invention.

Preferred embodiments of the present invention will now be described in detail in accordance with the accompanying drawings.

The following embodiments are intended to embody the technical idea of the present invention and do not limit the present invention. The sizes and positional relationships of the members illustrated in the drawings may be exaggerated for clarity of explanation. In the following description, the same components are denoted by the same reference numerals, and description thereof may be omitted.

First Embodiment

Figure 2:
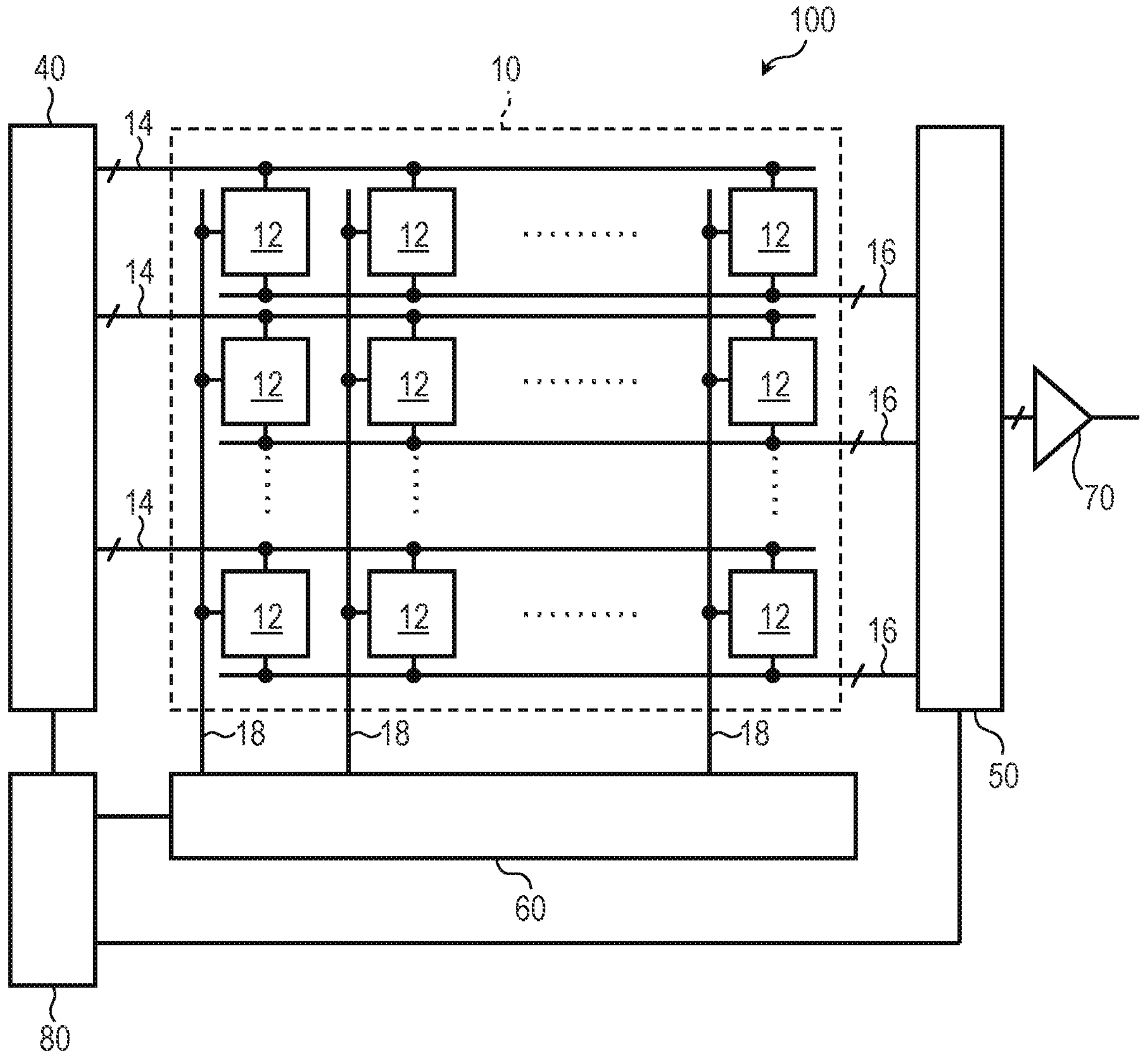
Figure 3:
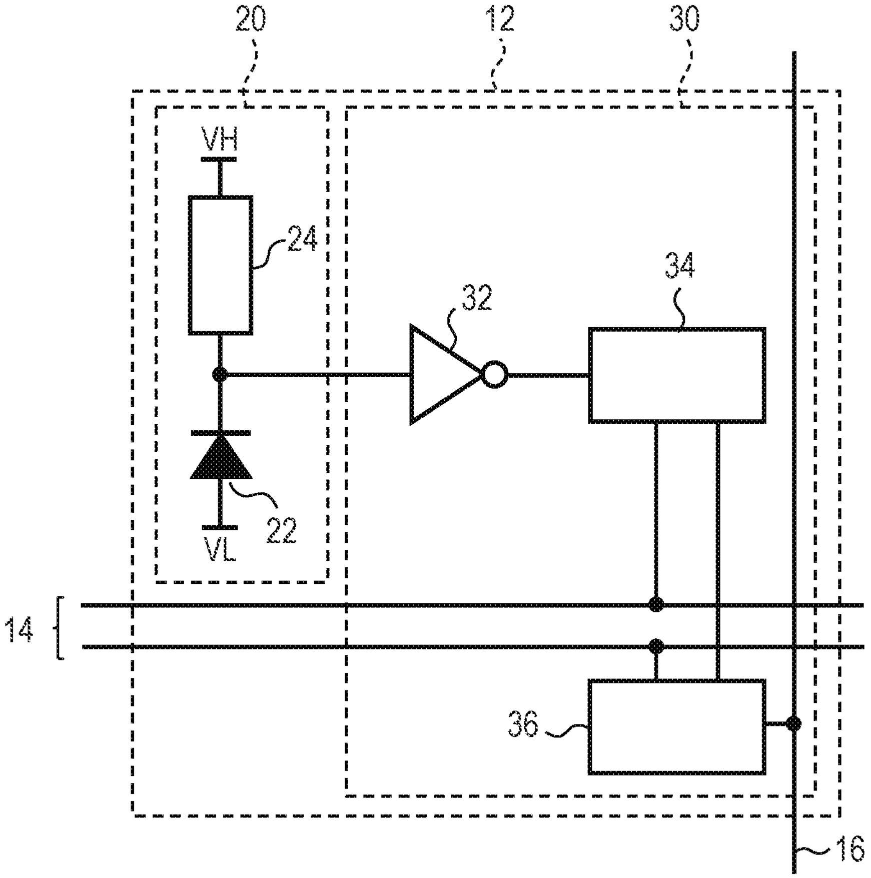
FIG. 3 is a block diagram illustrating a configuration example of a pixel of the photoelectric conversion device according to the first embodiment of the present invention.
Figure 4:
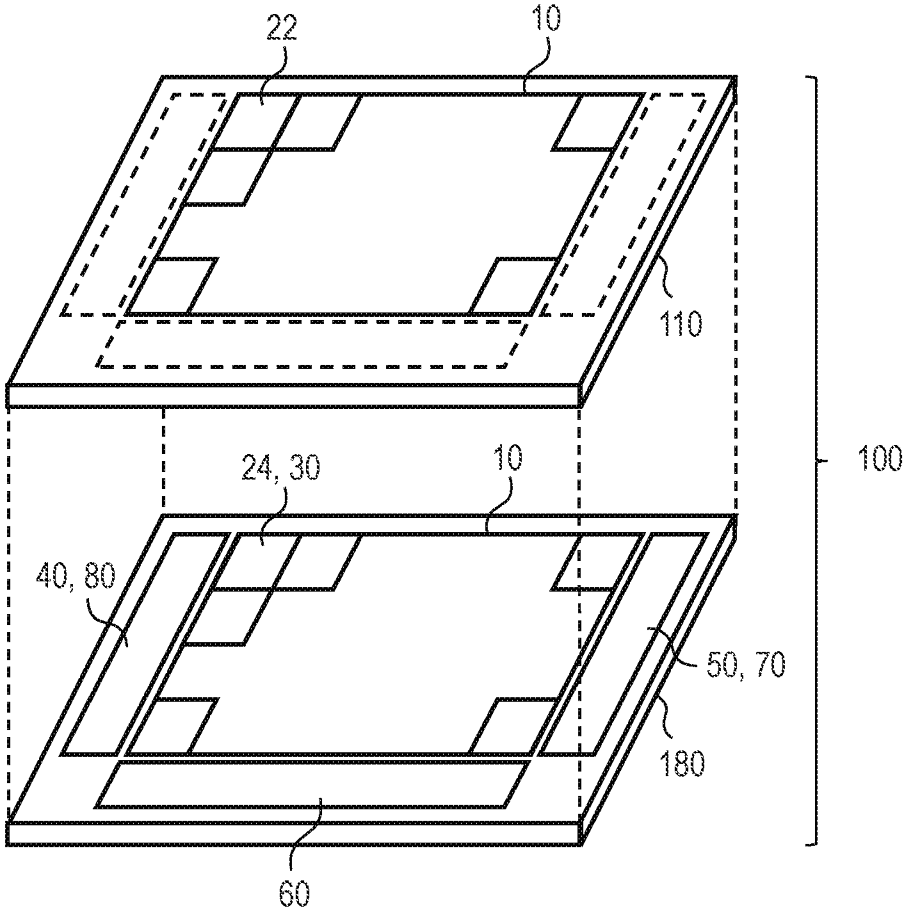
FIG. 4 is a perspective view illustrating a configuration example of the photoelectric conversion device according to the first embodiment of the present invention.

A schematic configuration of a photoelectric conversion device according to a first embodiment of the present invention will be described with reference to FIG. 1 to FIG. 4. FIG. 1 and FIG. 2 are block diagrams illustrating a schematic configuration of a photoelectric conversion device according to the present embodiment. FIG. 3 is a block diagram illustrating a configuration example of a pixel of the photoelectric conversion device according to the present embodiment. FIG. 4 is a perspective view illustrating a configuration example of the photoelectric conversion device according to the present embodiment.

As illustrated in FIG. 1, the photoelectric conversion device 100 according to the present embodiment includes a pixel unit 10, a vertical scanning circuit unit 40, a readout circuit unit 50, a horizontal scanning circuit unit 60, an output circuit unit 70, and a control pulse generation unit 80.

The pixel unit 10 is provided with a plurality of pixels 12 arranged in an array so as to form a plurality of rows and a plurality of columns. Each pixel 12 may include a photoelectric conversion unit including a photoelectric conversion element and a pixel signal processing unit that processes a signal output from the photoelectric conversion unit, as will be described later. The number of pixels 12 constituting the pixel unit 10 is not particularly limited. For example, the pixel unit 10 may be configured by a plurality of pixels 12 arranged in an array of several thousands of rows and several thousands of columns as in a general digital camera. Alternatively, the pixel unit 10 may include a plurality of pixels 12 arranged in one row or one column. Alternatively, the pixel unit 10 may be constituted by one pixel 12.

In each row of the pixel array of the pixel unit 10, a control line 14 is arranged extending in a first direction (a lateral direction in FIG. 1). Each of the control lines 14 is connected to the pixels 12 arranged in the first direction on the corresponding row, and serves as a signal line common to these pixels 12. The first direction in which the control lines 14 extend may be referred to as a row direction or a horizontal direction. Each of the control lines 14 may include a plurality of signal lines for supplying a plurality of types of control signals to the pixels 12. The control line 14 in each row is connected to the vertical scanning circuit unit 40.

In addition, in each column of the pixel array of the pixel unit 10, a data line 16 is arranged so as to extend in a second direction (a vertical direction in FIG. 1) intersecting with the first direction. Each of the data lines 16 is connected to the pixels 12 arranged in the second direction on the corresponding column, and serves as a signal line common to these pixels 12. The second direction in which the data lines 16 extend may be referred to as a column direction or a vertical direction. Each of the data lines 16 may include a plurality of signal lines, e.g., for transferring a digital signal of a plurality of bits output from the pixel 12 bit by bit.

The control line 14 in each row is connected to the vertical scanning circuit unit 40. The vertical scanning circuit unit 40 is a control unit having a function of receiving a control signal output from the control pulse generation unit 80, generating a control signal for driving the pixels 12, and supplying the generated control signal to the pixels 12 via the control lines 14. A logic circuit such as a shift register or an address decoder may be used for the vertical scanning circuit unit 40. The vertical scanning circuit unit 40 sequentially scans the pixels 12 in the pixel unit 10 in units of rows, and outputs pixel signals of the pixels 12 to the readout circuit unit 50 via the data lines 16.

The data line 16 in each column is connected to the readout circuit unit 50. The readout circuit unit 50 includes a plurality of holding units (not illustrated) provided corresponding to each column of the pixel array of the pixel unit 10, and has a function of holding the pixel signals of the pixels 12 of each column output from the pixel unit 10 in units of rows via the data lines 16 in the holding units of the corresponding columns.

The horizontal scanning circuit unit 60 is a control unit that receives a control signal output from the control pulse generation unit 80, generates a control signal for reading out the pixel signal from the holding unit of each column of the readout circuit unit 50, and supplies the control signal to the readout circuit unit 50. A logic circuit such as a shift register or an address decoder may be used for the horizontal scanning circuit unit 60. The horizontal scanning circuit unit 60 sequentially scans the holding units of the respective columns of the readout circuit unit 50, and sequentially outputs the pixel signals held in the respective columns to the output circuit unit 70.

The output circuit unit 70 includes an external interface circuit, and outputs the pixel signals output from the readout circuit unit 50 to the outside of the photoelectric conversion device 100. The external interface circuit included in the output circuit unit 70 is not particularly limited. A SerDes (SERializer/DESerializer) transmission circuit such as a LVDS (Low Voltage Differential Signaling) circuit or a SLVS (Scalable Low Voltage Signaling) circuit may be applied to the external interface circuit.

The control pulse generation unit 80 is a control circuit for generating a control signal for controlling the operations and timings of the vertical scanning circuit unit 40, the readout circuit unit 50, and the horizontal scanning circuit unit 60, and supplying the generated control signal to each functional block. At least a part of the control signals for controlling the operations and timings of the vertical scanning circuit unit 40, the readout circuit unit 50, and the horizontal scanning circuit unit 60 may be supplied from the outside of the photoelectric conversion device 100.

The connection mode of each functional block of the photoelectric conversion device 100 is not limited to the configuration example illustrated in FIG. 1, and may be configured as illustrated in FIG. 2, for example.

In the configuration example of FIG. 2, a data line 16 extending in the first direction is arranged in each row of the pixel array of the pixel unit 10. Each of the data lines 16 is connected to the pixels 12 arranged in the first direction on the corresponding row, and serves as a signal line common to these pixels 12. In addition, a control line 18 extending in the second direction is arranged in each column of the pixel array of the pixel unit 10. Each of the control lines 18 is connected to the pixels 12 arranged in the second direction on the corresponding column, and serves as a signal line common to these pixels 12.

The control line 18 in each column is connected to the horizontal scanning circuit unit 60. The horizontal scanning circuit unit 60 receives a control signal output from the control pulse generation unit 80, generates a control signal for reading out a pixel signal from the pixel 12, and supplies the generated control signal to the pixel 12 via the control line 18. Specifically, the horizontal scanning circuit unit 60 sequentially scans the plurality of pixels 12 of the pixel unit 10 in units of columns, and outputs pixel signals of the pixels 12 in each row belonging to the selected column to the data lines 16.

The data line 16 of each row is connected to the readout circuit unit 50. The readout circuit unit 50 includes a plurality of holding units (not illustrated) provided corresponding to each row of the pixel array of the pixel unit 10, and has a function of holding the pixel signals of the pixels 12 of each row output from the pixel unit 10 in units of columns via the data lines 16 in the holding units of the corresponding rows.

The readout circuit unit 50 receives the control signal output from the control pulse generation unit 80, and sequentially outputs the pixel signals held in the holding units of the respective rows to the output circuit unit 70.

Other configurations in the configuration example of FIG. 2 may be similar to those in the configuration example of FIG. 1.

As illustrated in FIG. 3, each pixel 12 includes a photoelectric conversion unit 20 and a pixel signal processing unit 30. The photoelectric conversion unit 20 includes a photoelectric conversion element 22 and a quenching element 24. The pixel signal processing unit 30 is a signal processing circuit that processes a signal output from the photoelectric conversion unit 20, and may include, for example, a waveform shaping unit 32, a counter circuit 34, and a selection circuit 36.

The photoelectric conversion element 22 may be an avalanche photodiode (hereinafter referred to as "APD"). An anode of the APD constituting the photoelectric conversion element 22 is connected to a node to which the voltage VL is supplied. A cathode of the APD constituting the photoelectric conversion element 22 is connected to one terminal of the quenching element 24. A connection node between the photoelectric conversion element 22 and the quenching element 24 is an output node of the photoelectric conversion unit 20. The other terminal of the quenching element 24 is connected to a node to which a voltage VH higher than the voltage VL is supplied. The voltage VL and the voltage VH are set such that a reverse bias voltage sufficient for the APD to perform the avalanche multiplication operation is applied. In one example, a negative high voltage may be applied as the voltage VL, and a positive voltage about a power supply voltage may be applied as the voltage VH. For example, the voltage VL may be −30 V and the voltage VH may be 1 V.

The photoelectric conversion element 22 may be formed of APD as described above. By supplying a reverse bias voltage sufficient to perform the avalanche multiplication operation to the APD, charges generated by light incidence to the APD cause avalanche multiplication, and an avalanche current is generated. The operation modes in a state where a reverse bias voltage is supplied to the APD include a Geiger mode and a linear mode. The Geiger mode is an operation mode in which a voltage applied between the anode and the cathode is set to a reverse bias voltage larger than a breakdown voltage of the APD. The linear mode is an operation mode in which a voltage applied between the anode and the cathode is set to a reverse bias voltage close to or lower than a breakdown voltage of the APD. The APD operating in the Geiger mode is called SPAD (Single Photon Avalanche Diode). The APD constituting the photoelectric conversion element 22 may operate in the Geiger mode rather than the linear mode.

In the present embodiment, the anode of the APD is set to a fixed potential, and a signal is extracted from the cathode side. Therefore, the semiconductor region of the first conductivity type in which a charge having the same polarity as the signal charge is a majority carrier is an n-type semiconductor region, and the semiconductor region of the second conductivity type in which a charge having a polarity different from the signal charge is a majority carrier is a p-type semiconductor region. The carriers of the first conductivity type are electrons, and the carriers of the second conductivity type are holes. Note that the present invention could also include the operation in which the cathode of the APD is set to a fixed potential and a signal is extracted from the anode side. In this case, the semiconductor region of the first conductivity type in which a charge having the same polarity as the signal charge is a majority carrier is a p-type semiconductor region, and the semiconductor region of the second conductivity type in which a charge having a polarity different from the signal charge is a majority carrier is an n-type semiconductor region. Although the case where one node of the APD is set to a fixed potential is described below, potentials of both nodes may be varied.

The quenching element 24 has a function of converting a change in the avalanche current generated in the photoelectric conversion element 22 into a voltage signal. Further, the quenching element 24 functions as a load circuit (quenching circuit) at the time of signal multiplication by avalanche multiplication, and has a function of reducing a voltage applied to the photoelectric conversion element 22 to suppress avalanche multiplication. The operation in which the quenching element 24 suppresses avalanche multiplication is called a quenching operation. Further, the quenching element 24 has a function of returning the voltage supplied to the photoelectric conversion element 22 to the voltage VH by passing a current corresponding to the voltage drop by the quenching operation. The operation in which the quenching element 24 returns the voltage supplied to the photoelectric conversion element 22 to the voltage VH is called a recharging operation. The quenching element 24 may be composed of a resistor, a MOS transistor, or the like.

The waveform shaping unit 32 includes an input node to which an output signal of the photoelectric conversion unit 20 is supplied and an output node. The waveform shaping unit 32 has a function of converting an analog signal supplied from the photoelectric conversion unit 20 into a pulse signal. The waveform shaping unit 32 may be configured by a logic circuit including a NOT circuit (inverter circuit), a NOR circuit, a NAND circuit, and the like. The output node of the waveform shaping unit 32 is connected to the counter circuit 34.

The counter circuit 34 includes an input node to which an output signal of the waveform shaping unit 32 is supplied, an input node connected to the control line 14, and an output node. The counter circuit 34 has a function of counting pulses to be superimposed on a signal output from the waveform shaping unit 32, and holding a count value as a counting result. The signal supplied from the vertical scanning circuit unit 40 to the counter circuit 34 via the control line 14 may include an enable signal for controlling a pulse counting period (exposure period), a reset signal for resetting a count value held by the counter circuit 34, and the like. An output node of the counter circuit 34 is connected to the data line 16 via the selection circuit 36.

The selection circuit 36 has a function of switching an electrical connection state (connection or disconnection) between the counter circuit 34 and the data line 16. The selection circuit 36 switches the connection state between the counter circuit 34 and the data line 16 in accordance with a control signal supplied from the vertical scanning circuit unit 40 via the control line 14 (in the configuration example of FIG. 2, a control signal supplied from the horizontal scanning circuit unit 60 via the control line 18 may be used). The selection circuit 36 may include a buffer circuit for outputting a signal.

The pixel 12 is typically a unit structure that outputs a pixel signal for forming an image. However, in the case where distance measurement or the like using a time of light (TOF) method is intended, the pixel 12 need not necessarily be a unit structure that outputs the pixel signal for forming the image. That is, the pixel 12 may be a unit structure that outputs a signal for measuring the time at which light has reached and the amount of light.

It is not necessary that the pixel signal processing unit 30 is provided for each of the pixels 12, and one pixel signal processing unit 30 may be provided for a plurality of pixels 12.

In this case, one pixel signal processing unit 30 may be used to sequentially perform signal processing of the plurality of pixels 12.

The photoelectric conversion device 100 according to the present embodiment may be formed on one substrate, or may be configured as a stacked-type photoelectric conversion device in which a plurality of substrates are stacked. In the latter case, for example, as illustrated in FIG. 4, a sensor substrate 110 and a circuit substrate 180 may be stacked and electrically connected to each other to form the stacked-type photoelectric conversion device. At least the photoelectric conversion element 22 among the constituent elements of the pixel 12 may be disposed on the sensor substrate 110. Further, the quenching element 24 and the pixel signal processing unit 30 among the components of the pixel 12 may be disposed on the circuit substrate 180.

The photoelectric conversion element 22, and the quenching element 24 and the pixel signal processing unit 30 may be electrically connected to each other via an interconnection provided for each pixel 12. The circuit substrate 180 may further include the vertical scanning circuit unit 40, the readout circuit unit 50, the horizontal scanning circuit unit 60, the output circuit unit 70, the control pulse generation unit 80, and the like.

The photoelectric conversion element 22 of each pixel 12, and the quenching element 24 and the pixel signal processing unit 30 may be provided on the sensor substrate 110 and the circuit substrate 180 so as to overlap each other in a plan view. The vertical scanning circuit unit 40, the readout circuit unit 50, the horizontal scanning circuit unit 60, the output circuit unit 70, and the control pulse generation unit 80 may be disposed around the pixel unit 10 including the plurality of pixels 12. Here, the "plan view" refers to a view from a direction perpendicular to the surface of the sensor substrate 110.

By configuring the stacked-type photoelectric conversion device 100, the degree of integration of elements may be increased and high functionality may be achieved. In particular, by disposing the photoelectric conversion element 22, and the quenching element 24 and the pixel signal processing unit 30 on different substrates, the photoelectric conversion element 22 may be disposed at high density without sacrificing the light receiving area of the photoelectric conversion element 22, and the photon detection efficiency may be improved.

The number of substrates constituting the photoelectric conversion device 100 is not limited to two, and three or more substrates may be stacked to form the photoelectric conversion device 100.

Although the sensor substrate 110 and the circuit substrate 180 are diced chips in FIG. 4, the sensor substrate 110 and the circuit substrate 180 are not limited to chips. For example, each of the sensor substrate 110 and the circuit substrate 180 may be a wafer. Further, the sensor substrate 110 and the circuit substrate 180 may be stacked in a wafer state and then diced, or may be stacked and bonded after each sensor substrate 110 and the circuit substrate 180 are formed into chips.

Figure 5A:
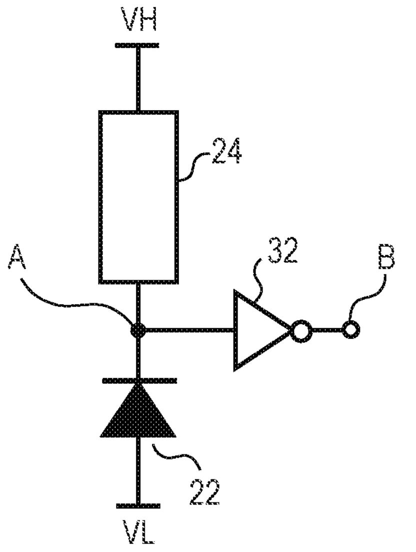
FIG. 5A, FIG. 5B, and FIG. 5C are diagrams illustrating the basic operation of the photoelectric conversion unit in the photoelectric conversion device according to the first embodiment of the present invention.
Figure 5B:
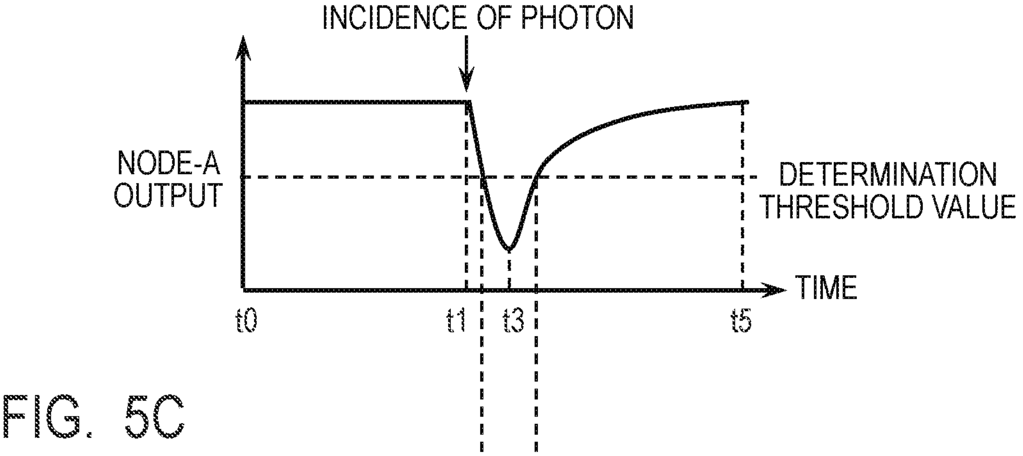
Figure 5C:
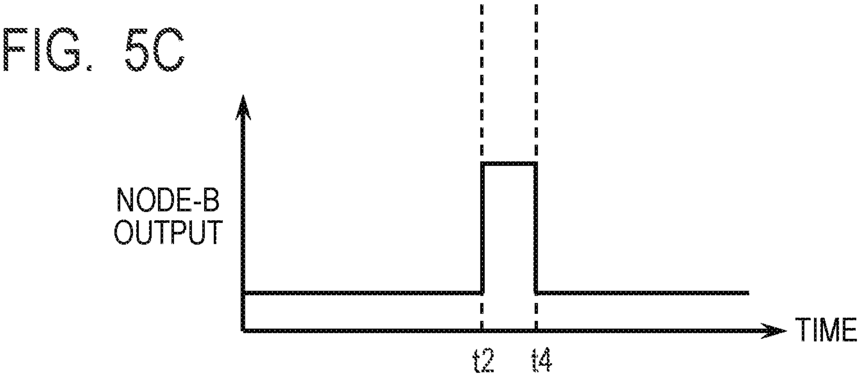

Next, a basic operation of the photoelectric conversion unit 20 in the photoelectric conversion device according to the present embodiment will be described with reference to FIG. 5A to FIG. 5C. FIG. 5A to FIG. 5C are diagrams illustrating the basic operation of the photoelectric conversion unit in the photoelectric conversion device according to the present embodiment. FIG. 5A is a circuit diagram of the photoelectric conversion unit 20 and the waveform shaping unit 32, FIG. 5B illustrates a waveform of a signal at an input node of the waveform shaping unit 32 (node A), and FIG. 5C illustrates a waveform of a signal at an output node of the waveform shaping unit 32 (node B). Here, for simplicity of explanation, the waveform shaping unit 32 is assumed to be an inverter circuit.

At time t0, a reverse bias voltage of a potential difference corresponding to (VH-VL) is applied to the photoelectric conversion element 22. Although a reverse bias voltage sufficient to cause avalanche multiplication is applied between the anode and the cathode of the APD constituting the photoelectric conversion element 22, avalanche multiplication does not occur because no photon is incident on the photoelectric conversion element 22. Therefore, no current flows through the photoelectric conversion element 22.

At time t1, it is assumed that a photon enters the photoelectric conversion element 22.

When a photon is incident on the photoelectric conversion element 22, an electron-hole pair is generated by photoelectric conversion, avalanche multiplication is caused by these carriers, and an avalanche multiplication current flows through the photoelectric conversion element 22. When the avalanche multiplication current flows through the quenching element 24, a voltage drop at the quenching element 24 occurs, and the voltage of the node A begins to drop. When the voltage drop amount of the node A increases and the avalanche multiplication stops at time t3, the voltage level of the node A does not drop any further.

When the avalanche multiplication in the photoelectric conversion element 22 stops, a current that compensates the voltage drop flows from the node to which the voltage VH is supplied to the node A via the quenching element 24, and the voltage of the node A gradually increases. Then, at time t5, the node A is settled to the original voltage level VH.

The waveform shaping unit 32 binarizes the signal input from the node A according to a predetermined determination threshold value, and outputs the signal from the node B. Specifically, the waveform shaping unit 32 outputs a low-level signal from the node B when the voltage level of the node A exceeds the determination threshold value, and outputs a high-level signal from the node B when the voltage level of the node A is lower than the determination threshold value. For example, as illustrated in FIG. 5B, it is assumed that the voltage of the node A is equal to or lower than the determination threshold value during a period from the time t2 to the time t4. In this case, as illustrated in FIG. 5C, the signal level at the node B becomes low-level during the period from the time t0 to the time t2, and during the period from the time t4 to the time t5, and becomes high-level during the period from the time t2 to the time t4.

Thus, the analog signal input from the node A is shaped into a digital signal by the waveform shaping unit 32. A pulse signal output from the waveform shaping unit 32 in response to incidence of a photon on the photoelectric conversion element 22 is a photon detection pulse signal.

Figure 6:
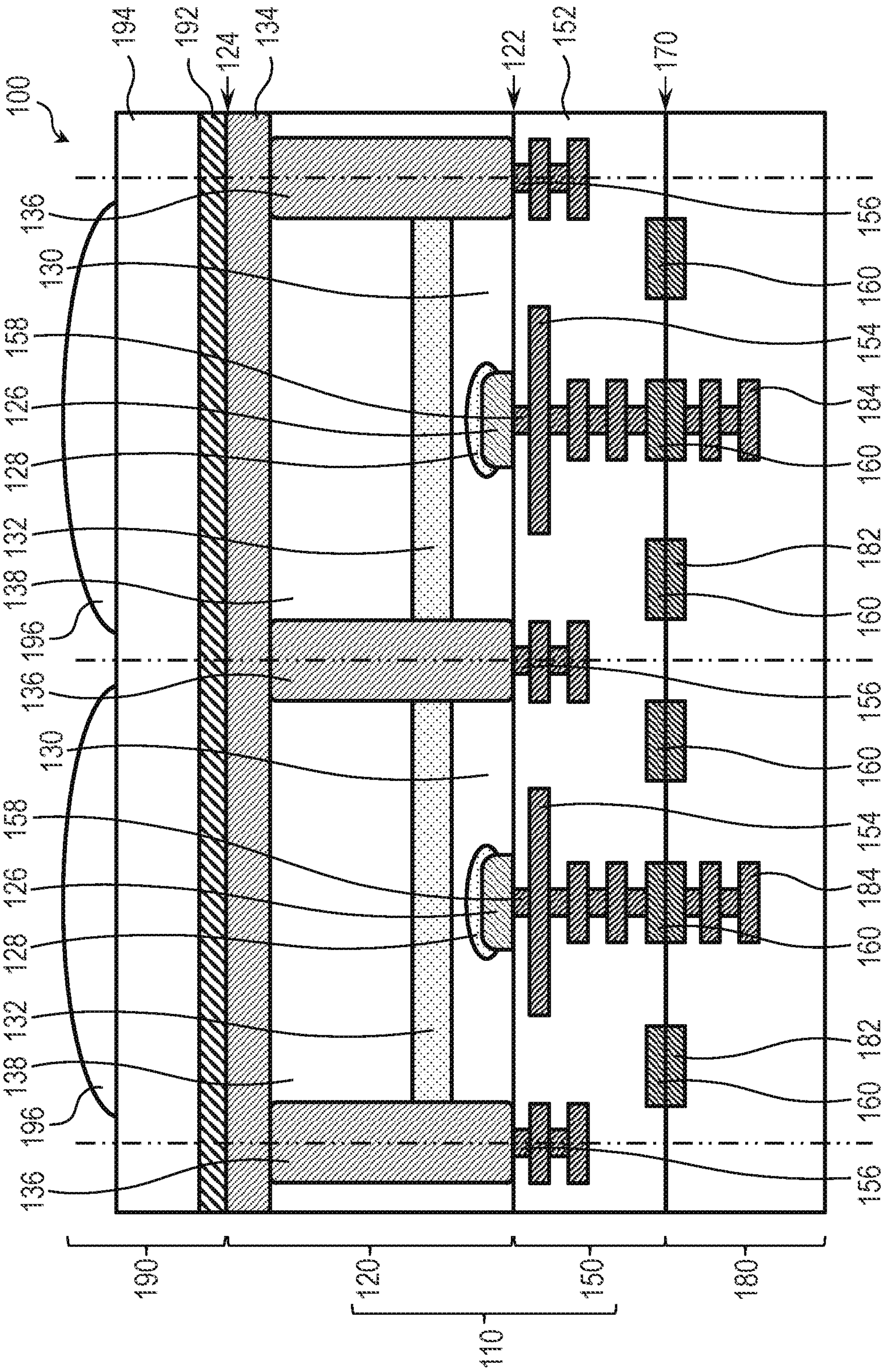
FIG. 6 is a schematic cross-sectional view illustrating a structure of the photoelectric conversion device according to the first embodiment of the present invention.
Figure 7:
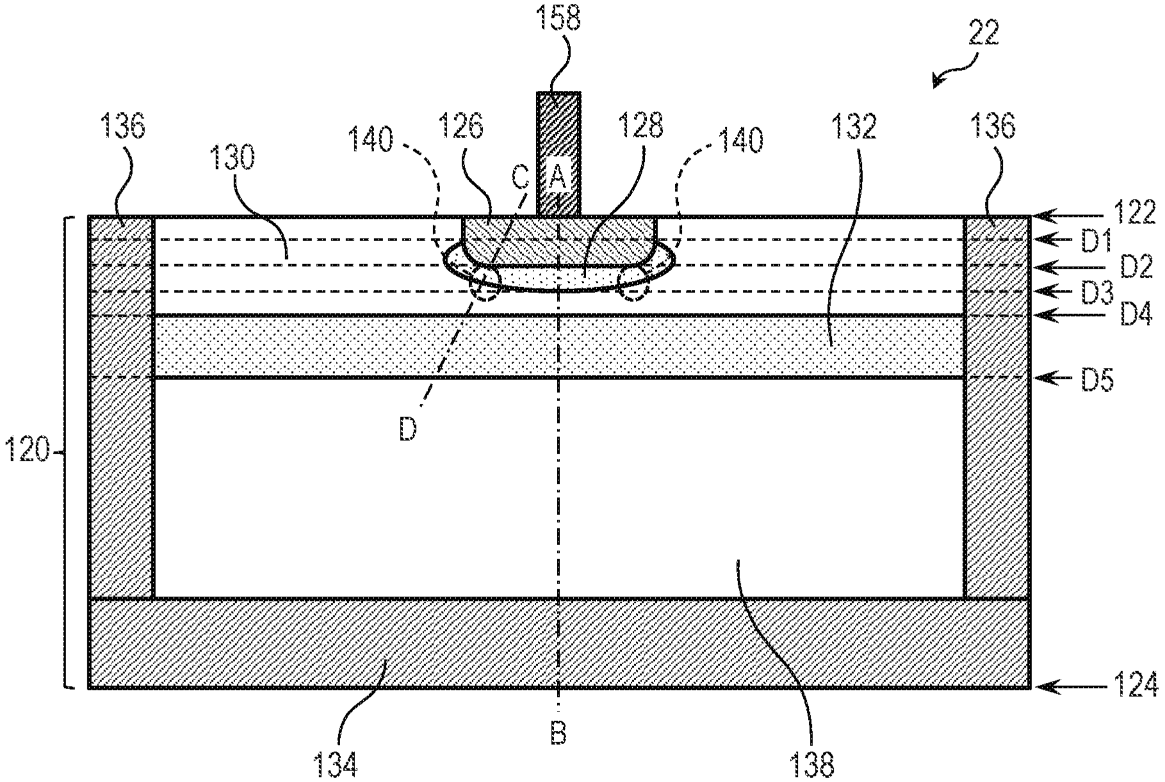
FIG. 7 is a schematic cross-sectional view illustrating a structure of a photoelectric conversion element in the photoelectric conversion device according to the first embodiment of the present invention.

Next, a specific element structure of the photoelectric conversion device 100 according to the present embodiment will be described with reference to FIG. 6 and FIG. 7. FIG. 6 is a schematic cross-sectional view illustrating the structure of the photoelectric conversion device according to the present embodiment. FIG. 7 is a schematic cross-sectional view illustrating a structure of a photoelectric conversion element in the photoelectric conversion device according to the present embodiment. FIG. 6 illustrates a schematic configuration of two pixels 12 arranged adjacent to each other among the plurality of pixels 12 constituting the pixel unit 10. A two-dot chain line illustrated in FIG. 6 indicates a boundary between adjacent pixels 12. FIG. 7 illustrates a portion of the photoelectric conversion element 22 among the constituent elements of the pixel 12.

As illustrated in, e.g., FIG. 6, the photoelectric conversion device 100 according to the present embodiment may be configured as a stacked-type photoelectric conversion device in which the sensor substrate 110 and the circuit substrate 180 are stacked. The sensor substrate 110 includes a semiconductor layer 120 having a first surface 122 and a second surface 124 opposed to the first surface 122, and an interconnection structure layer 150 provided on a side of the first surface 122 of the semiconductor layer 120.

An optical structure layer 190 may be disposed on a side of the second surface 124 of the semiconductor layer 120. A circuit substrate 180 is stacked on a side of the interconnection structure layer 150 of the sensor substrate 110. A bonding surface 170 in FIG. 6 is a bonding portion between the sensor substrate 110 and the circuit substrate 180. In the photoelectric conversion device according to the present embodiment, the side of the second surface 124 of the semiconductor layer 120 provided with the optical structure layer 190 serves as a light receiving surface for receiving light to be detected. That is, the photoelectric conversion device according to the present embodiment is a so-called back-illuminated photoelectric conversion device.

Among the constituent elements of the pixel 12, at least the photoelectric conversion element 22 is provided in the semiconductor layer 120. The semiconductor layer 120 is formed by thinning a single crystalline silicon substrate, for example, and contains n-type impurities or p-type impurities at a predetermined concentration. In the present embodiment, as an example, a semiconductor layer 120 in which an n-type silicon substrate having a low impurity density is thinned is assumed.

As illustrated in FIG. 6 and FIG. 7, the semiconductor layer 120 is provided with n-type semiconductor regions 126, 128, and 130, p-type semiconductor regions 132, 134, and 136, and a semiconductor region 138. The p-type semiconductor region 134 is provided on the side of the second surface 124 of the semiconductor layer 120 in a cross-sectional view. The p-type semiconductor region 134 is provided over the entire region where the photoelectric conversion element 22 is disposed, and overlaps the n-type semiconductor regions 126, 128, and 130, the p-type semiconductor regions 132 and 136, and the semiconductor region 138 in a plan view. When a back-illuminated photoelectric conversion device is configured, the p-type semiconductor region 134 is preferably disposed so as to be in contact with the second surface 124. With this configuration, generation of a dark current at the second surface 124 may be prevented. The p-type semiconductor region 136 is provided at a boundary portion between adjacent photoelectric conversion elements 22. That is, the p-type semiconductor region 136 is provided so as to surround each of the regions where the photoelectric conversion elements 22 are arranged in the plan view. The p-type semiconductor region 136 is provided from the first surface 122 of the semiconductor layer 120 to a depth at which the p-type semiconductor region 134 is disposed. Although one photoelectric conversion element 22 is disposed in each of the regions surrounded by the p-type semiconductor region 136 in FIG. 6, two or more photoelectric conversion elements 22 may be disposed in each of the regions surrounded by the p-type semiconductor region 136.

The n-type semiconductor regions 126, 128, and 130, the p-type semiconductor region 132, and the semiconductor region 138 are provided inside the region surrounded by the p-type semiconductor regions 134 and 136. The n-type semiconductor region 126 is provided on the side of the first surface 122 of the semiconductor layer 120 so as to be separated from the p-type semiconductor region 136. The n-type semiconductor region 126 is provided in a region extending from the first surface 122 to a depth D2 closer to the second surface 124 than the first surface 122. The n-type semiconductor region 128 is provided apart from the p-type semiconductor region 136 so as to cover the side of the second surface 124 of the n-type semiconductor region 126. The n-type semiconductor region 128 is provided in a region ranging from a depth D1 on the side of the first surface 122 with respect to the depth D2 to a depth D3 on the side of the second surface 124 with respect to the depth D2, and has a peak of impurity density distribution in the vicinity of the depth D2. In the plan view, the n-type semiconductor region 126 and the n-type semiconductor region 128 have substantially the same shape, and may be disposed in a central portion of a region surrounded by the p-type semiconductor region 136. The n-type semiconductor region 130 is provided in a region extending from the first surface 122 to a depth D4 closer to the second surface 124 than the depth D3 so as to surround the n-type semiconductor regions 126 and 128. The n-type semiconductor region 130 is in contact with the n-type semiconductor regions 126 and 128 and the p-type semiconductor regions 132 and 136 at the peripheral edge portion. The p-type semiconductor region 132 is provided in a region extending from the depth D4 to a depth D5 closer to the second surface 124 than the depth D4. The p-type semiconductor region 132 is in contact with the p-type semiconductor region 136 at the peripheral portion in the plan view. The semiconductor region 138 is provided between the p-type semiconductor region 132 and the p-type semiconductor region 134, and is in contact with the p-type semiconductor regions 132, 134, and 136 at the peripheral edge portion. The conductivity type of the semiconductor region 138 is not particularly limited, and may be either an n-type or a p-type.

In this specification, the term "plan view" refers to a view taken from a normal direction of a light incident surface (the second surface 124) or an opposite surface thereof (the first surface 122) of the semiconductor layer 120. Further, "cross-sectional view" refers to a view taken from a normal direction of a cut surface parallel to the normal direction of the first surface 122 or the second surface 124 of the semiconductor layer 120.

The n-type semiconductor region 126 constitutes the cathode of the APD and is a portion in contact with a cathode electrode, and is formed of an n-type semiconductor containing a high n-type impurity density. The n-type semiconductor region 128 is formed of an n-type semiconductor having a lower impurity density than that of the n-type semiconductor region 126. The n-type semiconductor region 130 is formed of an n-type semiconductor having a lower impurity density than the n-type semiconductor regions 126 and 128. The p-type semiconductor region 132 is a region serving as the anode of the APD, and is formed of a p-type semiconductor containing p-type impurities. The semiconductor region 138 is a region serving as a photoelectric conversion region, and is formed of a semiconductor containing a low n-type impurity density or a low p-type impurity density. The p-type semiconductor regions 134 and 136 form an isolation portion that electrically isolates the photoelectric conversion elements 22. That is, the photoelectric conversion elements 22 arranged adjacent to each other are electrically isolated from each other by the p-type semiconductor regions 134 and 136. The p-type semiconductor region 134 also serves to determine the depth of the photoelectric conversion region.

In this specification, the term "impurity density" means a net impurity density (effective carrier density) obtained by subtracting the number of impurities compensated by the impurities of the opposite conductivity type. A region where the doped p-type impurity density is higher than the doped n-type impurity density becomes a p-type semiconductor region, and a region where the doped n-type impurity density is higher than the doped p-type impurity density becomes an n-type semiconductor region.

The interconnection structure layer 150 includes an insulating layer 152 and interconnection layers 154 disposed in the insulating layer 152. The interconnection layers 154 include an anode electrode 156 electrically connected to the p-type semiconductor region 136, a cathode electrode 158 electrically connected to the n-type semiconductor region 126, and a pad electrode 160 formed of an interconnection layer most distant from the semiconductor layer 120.

The circuit substrate 180 is stacked on the side of the interconnection structure layer 150 of the sensor substrate 110. A bonding surface 170 in FIG. 6 is a bonding portion between the sensor substrate 110 and the circuit substrate 180.

The circuit substrate 180 includes a semiconductor layer provided with an element such as a transistor and an interconnection structure layer provided on the semiconductor layer. FIG. 6 illustrates only a pad electrode 182 formed of the uppermost interconnection layer and a part of the interconnection layer 184 connected to the pad electrode 182 among the semiconductor layer and the interconnection structure layer constituting the circuit substrate 180 for simplification of the drawing. The sensor substrate 110 and the circuit substrate 180 may be bonded to each other by, for example, metal bonding between a metal member constituting the pad electrode 160 and a metal member constituting the pad electrode 182.

The optical structure layer 190 may include a pinning film 192, a planarization layer 194, and a microlens layer including a plurality of microlenses 196. The optical structure layer 190 may further include a filter layer (not illustrated). Various optical filters such as a color filter, an infrared light cut filter, and a monochrome filter may be applied to the filter layer. Instead of providing the p-type semiconductor region 134 in the semiconductor layer 120, the pinning film 192 may be provided so as to be in contact with the p-type semiconductor region 136. A known material may be applied to the pinning film 192.

In the photoelectric conversion element 22 according to the present embodiment, the depletion layer formed in the p-n junction between the n-type semiconductor region 126 and the p-type semiconductor region 132 becomes the avalanche multiplication region. The n-type semiconductor region 128 has a role of suppressing edge breakdown at an end portion of the n-type semiconductor region 126, and the impurity density is set lower than that of the n-type semiconductor region 126 under this purpose.

By disposing the n-type semiconductor region 128 having a lower impurity density than the n-type semiconductor region 126 on the side of the second surface 124, the electric field at the end portion of the n-type semiconductor region 126 can be relaxed, and breakdown can be suppressed from occurring locally at low voltage. It can also be said that the cathode of the photoelectric conversion element 22 is formed of two impurity regions having different impurity profiles, i.e., the n-type semiconductor region 126 and the n-type semiconductor region 128. That is, the n-type semiconductor region 128 is a part of the cathode substantially, and at least a part of the n-type semiconductor region 128 is depleted to locally relax the electric field intensity of a portion beneath the n-type semiconductor region 126. From such a viewpoint, the n-type semiconductor region 128 may be referred to as an LDC (Lightly Doped Cathode) in this specification.

The p-type semiconductor region 136 serves not only as an element isolation portion but also as a path for supplying a voltage to the p-type semiconductor region 132 constituting the anode of the APD, and also serves as a portion in contact with the anode electrode 156. Therefore, at least a part of the portion of the p-type semiconductor region 136 which is in contact with the first surface 122 is formed of a p-type semiconductor containing a high p-type impurity density. Since the n-type semiconductor region 130 disposed between the p-type semiconductor region 136 and the n-type semiconductor region 126 has a low impurity density, the electric field intensity in the horizontal direction is not strong enough to cause avalanche multiplication, and basically, avalanche multiplication does not occur in the horizontal direction. That is, the avalanche multiplication in the APD occurs between the n-type semiconductor region 126 and the p-type semiconductor region 132 opposed thereto. Therefore, even if dark electrons are generated in the vicinity of the first surface 122, the dark electrons do not cause avalanche multiplication in the horizontal direction, and are not detected as noise caused by the dark electrons. The element isolation portion disposed between the adjacent photoelectric conversion elements 22 may further include an insulating isolation structure in which an insulator is buried in a deep trench. In this case, the p-type semiconductor region 136 may be disposed around the insulating isolation structure.

In FIG. 7, the line A-B is a line parallel to the normal direction of the semiconductor layer 120 passing through the center of the n-type semiconductor region 126 in the plan view, and corresponds to a main path through which signal charges flow. The region 140 is a region between the peripheral portion of the n-type semiconductor region 126 and the p-type semiconductor region 132, and has a maximum electric field intensity in the p-n junction between the n-type semiconductor region 126 and the p-type semiconductor region 132. The C-D line assumes a path through the region 140 among paths through which signal charges flow.

Figure 8:
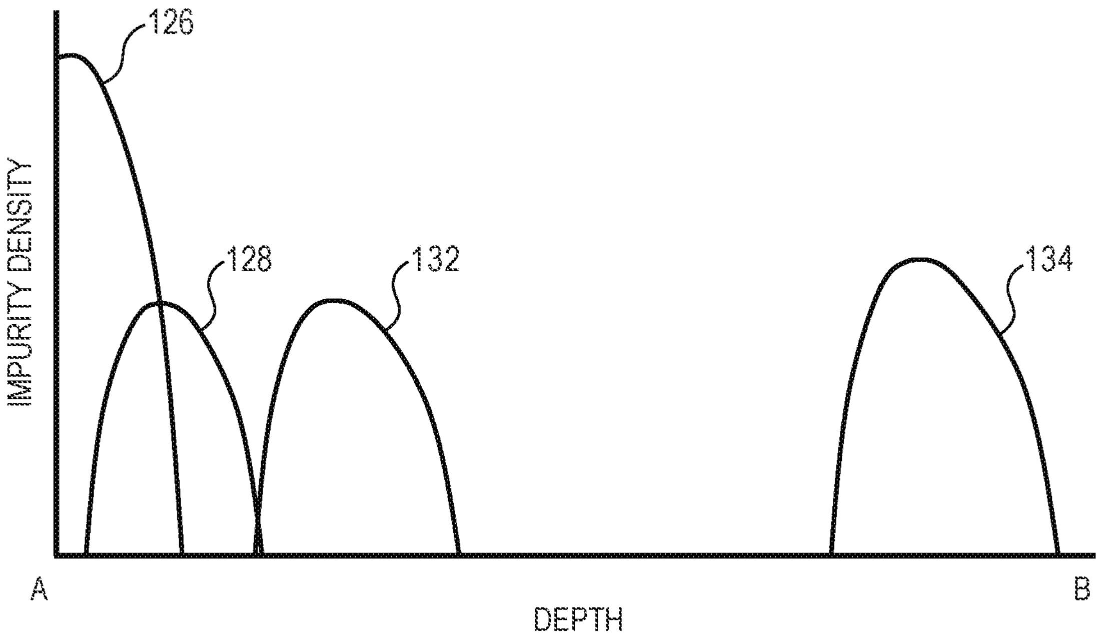
FIG. 8 is a graph illustrating a depth distribution of impurities constituting the photoelectric conversion element of the photoelectric conversion device according to the first embodiment of the present invention.

FIG. 8 is a graph illustrating the depth distribution of impurity density in the semiconductor layer 120 along the line A-B in FIG. 7. FIG. 8 illustrates n-type semiconductor regions 126 and 128 and p-type semiconductor regions 132 and 134 among the semiconductor regions constituting the photoelectric conversion element 22. Since the n-type semiconductor region 130 and the semiconductor region 138 are regions with low impurity density and do not significantly affect the n-type semiconductor regions 126 and 128 and the p-type semiconductor regions 132 and 134, illustration thereof is omitted here.

Figure 9:
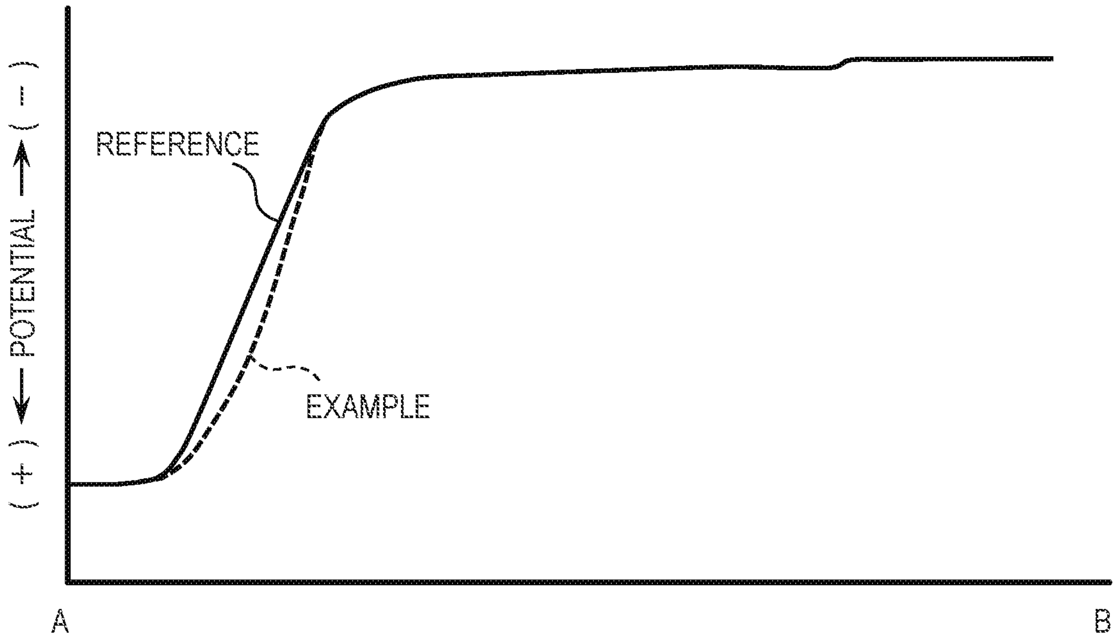
FIG. 9 and FIG. 10 are graphs illustrating potential distributions in the photoelectric conversion element.
Figure 10:
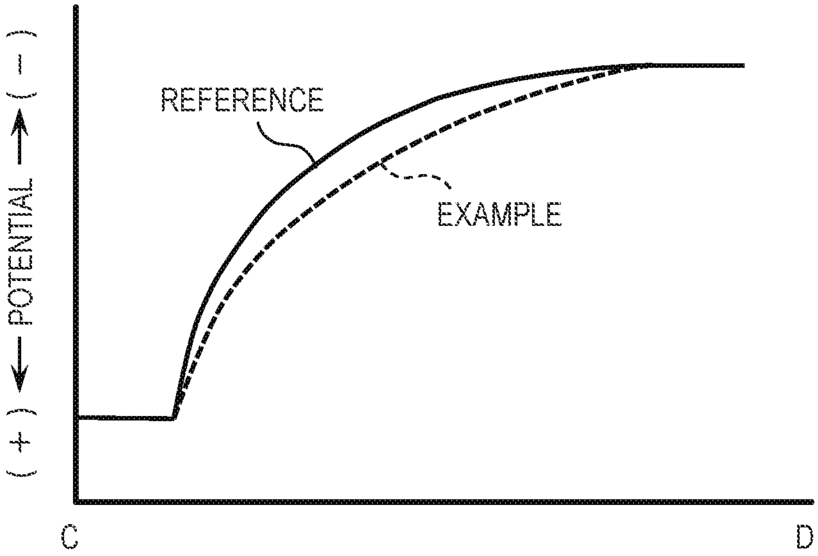

FIG. 9 is a graph illustrating a potential distribution in the semiconductor layer 120 along the line A-B in FIG. 7. FIG. 10 is a graph illustrating a potential distribution in the semiconductor layer 120 along the line C-D in FIG. 7. In FIG. 9 and FIG. 10, the vertical axis represents potential energy with respect to electrons. That is, the higher the vertical axis, the lower the potential, and the lower the vertical axis, the higher the potential. In FIG. 9 and FIG. 10, a solid line indicates a potential distribution when the n-type semiconductor region 128 is not provided (REFERENCE), and a broken line indicates a potential distribution when the n-type semiconductor region 128 is provided (EXAMPLE). The value of the reverse bias voltage applied between the anode and the cathode is the same in any case.

In the following description, the boundary surface of each semiconductor region is defined as follows. That is, the depth at which the impurity density becomes ⅕ with respect to the peak value of the impurity density of each semiconductor region is set as the boundary of the semiconductor region. Note that in the case where the value of ⅕ of the peak value of the impurity density exceeds $5\times10^{16}$ $cm^{-3}$, the depth at which the value of the impurity density becomes $5\times10^{16}$ $cm^{-3}$ is set as the boundary of the semiconductor region. The reason why the boundary of the semiconductor region is defined in this manner is that a portion where the impurity density is ⅕ or more of the peak value mostly plays a role of the semiconductor region. However, in the case of a semiconductor region having a high impurity density such as the n-type semiconductor region 126, a portion where the impurity density is ⅕ of the peak value may affect the other semiconductor regions. Therefore, in the case of a semiconductor region having a high impurity density in which a value of ⅕ of the peak value of the impurity density exceeds $5\times10^{16}$ $cm^{-3}$, considering the balance with a predetermined value of the boundary surface of another semiconductor region, it is appropriate to set the impurity density of about $5\times10^{16}$ $cm^{-3}$ as a predetermined value.

If the boundary of each semiconductor region can be defined, the shape of each semiconductor region is determined. Hereinafter, the shape of each semiconductor region in the photoelectric conversion element 22 according to the present embodiment illustrated in FIG. 7 will be described in detail.

The n-type semiconductor region 126 constituting the cathode body of the APD is formed in a part of the formation region of the photoelectric conversion element 22 in the plan view. In general, in the case where impurities are doped into a semiconductor layer by ion implantation, the smaller the area of a region to be doped, and the deeper the formation position, the larger the curvature of the central portion in the cross-sectional shape of the semiconductor region to be formed is. This is because the impurities forming the semiconductor region are distributed so that the density thereof decreases as the impurity is away from the central portion, and the impurity distribution tends to expand as the formation position is deeper.

Therefore, although the cross-sectional shape of the boundary portion of the n-type semiconductor region 126 formed at a very shallow position from the first surface 122 is substantially flat, the cross-sectional shape of the boundary portion of the n-type semiconductor region 128 serving as the LCD becomes close to a convex shape.

Note that although the prescribed value of the impurity density at the boundary surface of the n-type semiconductor region 126 may be considered to be $5\times10^{16}$ $cm^{-3}$ as described above, the prescribed value of the impurity density at the boundary surface of the n-type semiconductor region 128 is usually $2\times10^{16}$ $cm^{-3}$ to $5\times10^{16}$ $cm^{-3}$. The prescribed value of the impurity density at the boundary surface of the p-type semiconductor region 132 is usually $1\times10^{16}$ $cm^{-3}$ to $3\times10^{16}$ $cm^{-3}$. Note that the boundary surface described above is different from the boundary surface of the depletion layer generated during the actual operation. Depletion of the semiconductor region largely depends on not only the impurity density but also the electric field applied to each region.

Next, the region 140 will be described. According to electro-statics, an electric field concentrates in a portion having a large curvature at a boundary surface of a conductor. As can be seen from the cross-sectional shape illustrated in FIG. 7, the n-type semiconductor region 126 has a large curvature at the corner of the cross section, and an electric field is concentrated at this portion. However, the distance from the p-type semiconductor region 132 constituting the anode of the APD becomes long on a line extending obliquely 45 degrees from the corner portion, and the electric field becomes weak. Therefore, the region 140 where the electric field intensity is maximized is generated in a portion near the corner of the n-type semiconductor region 126 where the distance from the p-type semiconductor region 132 is short, that is, below the n-type semiconductor region 126.

Next, the n-type semiconductor region 128 constituting the LDC will be described. Although the n-type semiconductor region 128 has a peak of impurity distribution in the vicinity of the boundary surface of the n-type semiconductor region 126, a substantial portion of the n-type semiconductor region 128 is depleted during actual operation because of a low impurity density. Actually, a portion having an n-type impurity density of $5\times10^{17}$ $cm^{-3}$ or less is depleted. When the n-type semiconductor region is depleted, the region becomes a depletion layer in which positive ions are distributed. That is, the n-type semiconductor region 128 has an effect of electrostatically shielding the neutral region of the n-type semiconductor region 126, i.e., the cathode electrode portion, and the depletion region of the n-type semiconductor region 128 has an electric field intensity lower than that in the case where the n-type semiconductor region 128 is not provided.

In the potential distribution illustrated in FIG. 9, the electric field intensity is represented by the slope of the tangent of the graph. It is understood that the electric field intensity is weakened in the portion corresponding to the n-type semiconductor region 128 in the region below the n-type semiconductor region 126 as compared with the case where the n-type semiconductor region 128 is not provided. However, since the reverse bias voltage applied between the cathode and the anode does not change, the electric field intensity becomes stronger in the region below the n-type semiconductor region 128 because the electric field intensity is weakened in the portion corresponding to the n-type semiconductor region 128. Since the intensity of the electric field necessary for causing the breakdown is determined to some extent, the breakdown voltage is slightly lowered, and the operating voltage is also lowered by a corresponding amount. Therefore, considering the actual operating voltage, the electric field intensity in the region close to the cathode body beneath the cathode decreases due to the action of the n-type semiconductor region 128. However, the maximum electric field intensity between the A-B lines is slightly increased as compared with the case where the n-type semiconductor region 128 is not provided, and the position where the maximum electric field intensity is generated shifts in the deeper direction (the direction of the second surface 124). When it is considered that the n-type semiconductor region 128 constituting the LDC and the n-type semiconductor region 128 as the cathode main body form a cathode integrally, the distance between the cathode and the p-type semiconductor region 132 as the anode may be narrowed by introduction of the n-type semiconductor region 128.

Next, the electric field intensity in the vertical direction at a position slightly away from the cathode center portion in the plan view will be examined in consideration of reducing the operating voltage. Since the n-type semiconductor region 128 has a convex shape as described above, an increase in the maximum electric field intensity in the vertical direction due to introduction of the n-type semiconductor region 128 becomes smaller than that in the cathode center portion at a position slightly away from the cathode center portion. The vertical maximum electric field intensity at a position further away from the cathode center may turn to a decrease. This tendency can also be interpreted as the fact that electric field concentration occurs in the convex portion due to the convex shape of the n-type semiconductor region 128. Although it has been described that the electric field concentration occurs in the portion where the curvature of the conductor boundary is large, the electric field concentration occurs in the portion where the curvature of the boundary surface is large even in the depleted semiconductor region.

Next, the direct influence of the introduction of the n-type semiconductor region 128 on the region 140 will be described with reference to FIG. 10. In the absence of the n-type semiconductor region 128, the potential distribution line between the cathode and anode is linear in FIG. 9, and thus the electric field intensity represented by the slope of the tangent is substantially constant. However, in FIG. 10, the electric field intensity, i.e., the slope of the tangent of the potential distribution line, is largely different between the portion close to the n-type semiconductor region 126 and the portion distant from the n-type semiconductor region 126, and the electric field intensity is large in the portion close to the n-type semiconductor region 126 and is small in the portion distant from the n-type semiconductor region 126. This is because electric field concentration occurs in the vicinity of the corner of the n-type semiconductor region 126. When the n-type semiconductor region 128 is introduced in this state, the electric field intensity in the maximum electric field intensity portion (region 140) in the n-type semiconductor region 128 decreases due to the depletion of the n-type semiconductor region 128. Then, the electric field intensity increases in a deep portion away from the n-type semiconductor region 128, i.e., in a portion where the electric field intensity is originally low, so as to compensate for the decrease. In other words, the electric field intensity distribution between the cathode and the anode changes to be reduced on the C-D line, and as a result, the maximum electric field intensity on the C-D line decreases. Thus, the change in the electric field intensity on the C-D line due to the introduction of the n-type semiconductor region 128 is different from the increase in the maximum electric field intensity on the A-B line. This difference occurs due to the difference in electric field concentration between the planar portion and the corner portion of the boundary surface of the n-type semiconductor region 126. The strong electric field relaxation effect by the introduction of the semiconductor region having a low impurity density is exhibited in the corner portion where electric field concentration occurs.

Ultimately, by introducing the n-type semiconductor region 128, the electric field intensity in the region 140 is reduced by two effects, namely, the region 140 is at least partially covered by the n-type semiconductor region 128 and the n-type semiconductor region 128 itself has convex shape. The degree of reduction of the electric field intensity in the region 140 is greater than the increase of the maximum electric field intensity on the line A-B.

As described above, a change in the strong electric field region beneath the cathode by introducing the n-type semiconductor region 128 has been described. Next, it will be described that it is possible to obtain the effect of reducing the dark output with the strong electric field region beneath the cathode as a generation source, by introducing the n-type semiconductor region 128.

It is known that as the electric field increases, the carrier generation speed at the generation kevel increases exponentially. A photoelectric conversion element having a generation level in a maximum electric field intensity portion generates a very large dark current, which may cause a white defect. In addition, when the cathode has a circular shape in the plan view, the maximum electric field intensity portion in the lower portion of the peripheral edge of the cathode becomes a doughnut shape and occupies a large volume ratio in the high electric field region in the lower portion of the cathode. As a result, portions where a large dark current is generated is increased, and the number of pixels which cause a white defect is increased.

Since the carrier generation speed at the generation level increases exponentially with respect to the electric field intensity, if the average value of the electric field intensity distribution beneath the cathode is the same, the dark output becomes smaller as a whole as the distribution becomes closer to uniform. In other words, the dark output becomes larger as a whole when the region where the electric field intensity protrudes is partially included beneath the cathode.

As described above, the n-type semiconductor region 128 acts in a direction in which the electric field intensity distribution becomes uneven on the A-B line, but acts in a direction in which the electric field intensity becomes uniform on the C-D line. Considering that the volume of the maximum electric field intensity portion is large, by introducing the n-type semiconductor region 128, the electric field intensity in the lower portion of the cathode becomes uniform as a whole. As a result, it is possible to reduce a dark output with the strong electric field region in the lower portion of the cathode as a generation source.

In order for the n-type semiconductor region 128 to exhibit the above-described effect, it is important that the n-type semiconductor region 128 includes the maximum electric field intensity portion (region 140) in the plan view, and that the area of the n-type semiconductor region 128 in the plan view is made as small as possible to increase the curvature of the convex shape. These requirements can be suitably achieved by configuring the formation region of the n-type semiconductor region 126 and the formation region of the n-type semiconductor region 128 to be substantially the same in the plan view. In particular, it is preferable to form the n-type semiconductor region 126 and the n-type semiconductor region 128 by introducing n-type impurities using the same mask that exposes a region where they are to be formed. By forming the n-type semiconductor region 126 and the n-type semiconductor region 128 using the same mask, the n-type semiconductor region 126 and the n-type semiconductor region 128 always overlap each other in the plan view, and there is not the characteristics change due to positional displacement of these regions. Further, since the number of mask steps is not increased, the n-type semiconductor region 126 and the n-type semiconductor region 128 can be appropriately formed without requiring extra cost.

As described above, according to the present embodiment, it is possible to reduce the noise caused by the dark current generated in the strong electric field region in the photoelectric conversion element.

Second Embodiment

Figure 11:
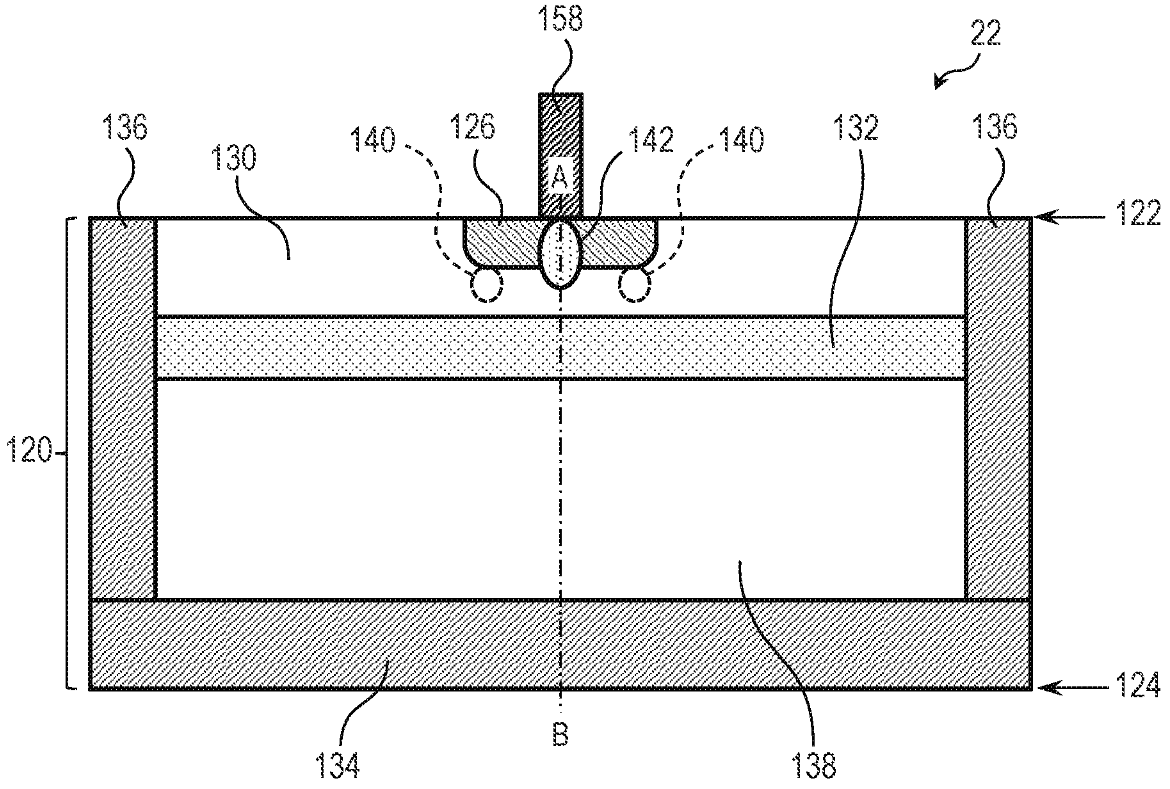
FIG. 11 is a schematic cross-sectional view illustrating a structure of a photoelectric conversion device according to a second embodiment of the present invention.

A photoelectric conversion device according to a second embodiment of the present invention will be described with reference to FIG. 11. FIG. 11 is a schematic cross-sectional view illustrating a structure of a photoelectric conversion element in the photoelectric conversion device according to the present embodiment. Components similar to those of the photoelectric conversion device according to the first embodiment are denoted by the same reference numerals, and description thereof will be omitted or simplified.

The photoelectric conversion device according to the present embodiment is the same as the photoelectric conversion device according to the first embodiment except that the configuration of the photoelectric conversion element 22 is different. In the present embodiment, differences from the photoelectric conversion element of the first embodiment will be mainly described, and description of the same portions as those of the first embodiment will be appropriately omitted.

As illustrated in FIG. 11, the photoelectric conversion element 22 of the photoelectric conversion device according to the present embodiment includes an n-type semiconductor region 142 instead of the n-type semiconductor region 128. The n-type semiconductor region 142 is positioned at the center of the n-type semiconductor region 126 in the plan view, and the area in the plan view is smaller than that of the n-type semiconductor region 126. The area of the n-type semiconductor region 142 in the plan view is desirably equal to or smaller than ⅑ of the area of the n-type semiconductor region 126 in the plan view. Although the peak position of the impurity density distribution of the n-type impurities constituting the n-type semiconductor region 142 is deeper than the peak position of the impurity density distribution of the n-type impurities constituting the n-type semiconductor region 126, the n-type semiconductor region 126 and the n-type semiconductor region 142 sufficiently overlap each other in the depth direction. The peak position of the impurity density distribution of the n-type impurities constituting the n-type semiconductor region 142 may be located inside the n-type semiconductor region 126.

The n-type semiconductor region 142 is not intended to function by depletion as in the n-type semiconductor region 128 in the first embodiment, but has an impurity density equal to or higher than a predetermined value. Therefore, considering that the n-type semiconductor region 126 and the n-type semiconductor region 142 are integrated to form a cathode, the cathode has a structure in which a center portion of a lower boundary surface is slightly projected. The boundary surface under the cathode may be defined as a portion where the n-type impurity density is $5\times10^{16}$ $cm^{-3}$.

Since the n-type semiconductor region 142 has a smaller area in the plan view than the n-type semiconductor region 126 and the n-type semiconductor region 128 of the first embodiment, the curvature at the bottom portion is larger than the curvature at the bottom portion of the n-type semiconductor region 128. The n-type semiconductor region 142 does not overlap with the region 140 where the electric field intensity is maximized. Therefore, the n-type semiconductor region 142 has no effect of directly relaxing the electric field in the region 140. However, the n-type semiconductor region 142 has an effect of increasing electric field concentration at the center of the cathode and relatively reducing electric field intensity beneath the cathode at a portion away from the center of the cathode. This is similar to the case of lowering the lightning strike probability at a place off the installation place of the lightning rod by installation of the lightning rod.

On the vertical line passing through the center portion of the cathode, as described above, the electric field intensity is increased by the electric field concentration due to the protrusion of the n-type semiconductor region 142, but on this line, the predetermined electric field intensity sufficient to cause the avalanche multiplication is sufficient because this line is also a path through which the signal charges pass. Accordingly, the operating voltage, i.e., the voltage applied between the cathode and the anode, can be reduced in response to an increase in the electric field intensity due to the provision of the n-type semiconductor region 142.

From the above, considering the operating voltage as well, according to the configuration of the present embodiment, the maximum electric field intensity on the line A-B slightly increases, but the electric field intensity in the region 140 decreases, as compared with the case where the n-type semiconductor region 142 is not provided. Accordingly, the intensity of the electric field beneath the cathode becomes uniform as a whole, and the electric field in the region 140 occupied by a large volume is reduced, so that the dark output with the strong electric field region under the cathode as a generation source can be reduced.

In order for the n-type semiconductor region 142 to exhibit the above-described effect, it is required to arrange the n-type semiconductor region 142 having an area sufficiently smaller than that of the n-type semiconductor region 126 at the center of the n-type semiconductor region 126 in the plan view. Although the n-type semiconductor region 142 having such a planar layout may be formed using a dedicated mask, the n-type semiconductor region 142 may be formed using a manufacturing process of the cathode electrode 158. In one example, the cathode electrode 158 is formed by burying a conductive material in a contact hole provided in the insulating layer 152. In this case, after the contact hole is formed in the insulating layer 152 and before the conductive material is buried in the contact hole, n-type impurities may be introduced by using an ion implantation with the insulating layer 152 as a mask, whereby the n-type semiconductor region 142 may be formed in self-alignment with the contact hole. Since the area of the cathode electrode 158 is sufficiently smaller than the area of the n-type semiconductor region 126 in the plan view and is disposed in the center of the n-type semiconductor region 126 in the plan view, the contact hole for burying the cathode electrode 158 is suitable for use in forming the n-type semiconductor region 142. In addition, since it is not necessary to add a mask step to form the n-type semiconductor region 142, the manufacturing cost does not increase.

As described above, according to the present embodiment, it is possible to reduce the noise caused by the dark current generated in the strong electric field region in the photoelectric conversion element.

Third Embodiment

Figure 12:
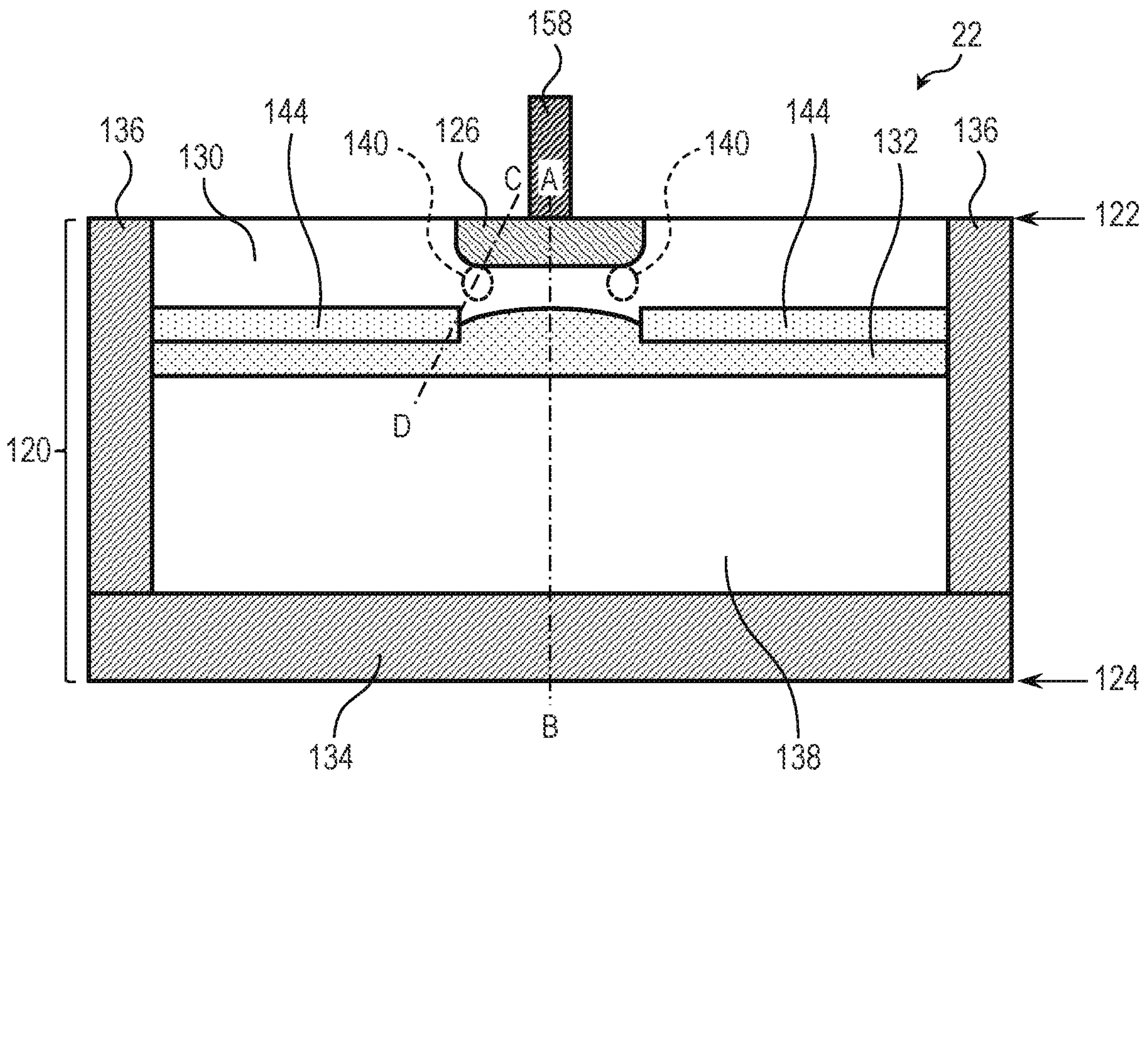
FIG. 12 is a schematic cross-sectional view illustrating a structure of a photoelectric conversion device according to a third embodiment of the present invention.

A photoelectric conversion device according to a third embodiment of the present invention will be described with reference to FIG. 12. FIG. 12 is a schematic cross-sectional view illustrating a structure of a photoelectric conversion element in the photoelectric conversion device according to the present embodiment. Components similar to those of the photoelectric conversion device according to the first or second embodiment are denoted by the same reference numerals, and description thereof will be omitted or simplified.

The photoelectric conversion device according to the present embodiment is the same as the photoelectric conversion device according to the first embodiment except that the configuration of the photoelectric conversion element 22 is different. In the present embodiment, differences from the photoelectric conversion element of the first embodiment will be mainly described, and description of the same portions as those of the first embodiment will be appropriately omitted.

As illustrated in FIG. 12, the photoelectric conversion element 22 of the photoelectric conversion device according to the present embodiment includes an n-type semiconductor region 144 instead of the n-type semiconductor region 128. The n-type semiconductor region 144 is disposed so as to surround the n-type semiconductor region 126 in the plan view. In addition, the n-type semiconductor region 144 is disposed such that a peak of the impurity density distribution is positioned at a tail portion of the p-type semiconductor region 132 on the side of the first surface 122 in the cross-sectional view, and has an impurity density that just compensates the p-type impurities in that portion. When compared with the impurity amount per unit area, the dose of the n-type impurities for forming the n-type semiconductor region 144 is smaller than the dose of the p-type impurities for forming the p-type semiconductor region 132. By the presence of the n-type semiconductor region 144, a part of the p-type impurities constituting the p-type semiconductor region 132 is compensated. That is, the effective impurity amount of the p-type impurity amount per unit area in the region where the n-type semiconductor region 144 is provided is smaller than the effective impurity amount of the p-type impurity amount per unit area in the region where the n-type semiconductor region 144 is not provided.

In other words, the distance between the boundary surface of the p-type semiconductor region 132 on the side of the first surface 122 and the first surface 122 is narrower in a region overlapping with the n-type semiconductor region 126 in the plan view than in a region not overlapping with the n-type semiconductor region 126 in the plan view.

Although FIG. 12 illustrates the n-type semiconductor region 144 in a simple rectangular shape, since the n-type impurities are distributed not only in the depth direction but also in the horizontal direction with a concentration gradient, the degree to which the p-type impurities constituting the p-type semiconductor region 132 are compensated decreases as the distance from the n-type semiconductor region 144 increases.

As a result, as illustrated in FIG. 12, the p-type semiconductor region 132 has an upward convex shape at a portion facing the n-type semiconductor region 126. Here, the impurity density at the boundary portion of the p-type semiconductor region 132 is defined by the net p-type impurity density after being compensated by the n-type impurities, and is typically about $1\times10^{16}$ $cm^{-3}$ to $3\times10^{16}$ $cm^{-3}$.

When comparing the case where the n-type semiconductor region 144 is not provided with the case where the n-type semiconductor region 144 is provided, if the dose of the p-type impurities for forming the p-type semiconductor region 132 is the same, the operating voltage becomes higher when the n-type semiconductor region 144 is provided. This is due to the fact that the distance between the cathode and the anode becomes substantially long by the p-type impurities being compensated, and that the electric field intensity between the cathode and the anode on the line A-B becomes weak due to a decrease in the net p-type impurity density of the p-type semiconductor region 132.

In order to make the idea easier to understand and to present a practical example, the amount of the p-type impurities doped to form the p-type semiconductor region 132 is increased in comparison with the case where the n-type semiconductor region 144 is not provided, so that the operating voltage does not change. Then, the maximum electric field intensity on the line A-B is slightly higher than that in the case where the n-type semiconductor region 144 is not provided. The electric field intensity between the cathode and the anode decreases as the distance from the line A-B increases. One of the reason is that the p-type semiconductor region 132 has an upward convex shape at a portion facing the n-type semiconductor region 126, and therefore the electric field concentrates on the center of the convex. Further, on the C-D line passing through the region 140, the distance between the n-type semiconductor region 126 constituting the cathode and the p-type semiconductor region 132 constituting the anode becomes long, and the electric field intensity on this line becomes small. Due to these two effects, the electric field intensity in the region 140 decreases.

As a result, by providing the n-type semiconductor region 144 and making the portion of the p-type semiconductor region 132 facing the n-type semiconductor region 126 convex upward, the electric field intensity beneath the cathode becomes uniform as a whole. By reducing the electric field intensity of the region 140 occupied by a large volume, the dark output with the strong electric field region under the cathode as a generation source can be reduced.

Since the n-type semiconductor region 144 is basically formed in a region which does not overlap with the n-type semiconductor region 126 in the plan view, a mask for forming the n-type semiconductor region 144 is required. The region to which the n-type impurities for forming the n-type semiconductor region 144 are not doped in the plan view is not necessarily the same as the region in which the n-type semiconductor region 126 is disposed in the plan view, and the areas of these regions may be different. In particular, when the area of the n-type semiconductor region 126 is relatively large, there is a case that the area of the region to which the n-type impurities for forming the n-type semiconductor region 144 are not doped may be preferably smaller than the area of the n-type semiconductor region 126. If the area of the region to which the n-type impurities for forming the n-type semiconductor region 144 are not doped is too large, the curvature of the upper surface of the p-type semiconductor region 132 at the portion facing the n-type semiconductor region 126 becomes small, and the electric field concentration effect at this portion becomes weak. The center of the region to which the n-type impurities for forming the n-type semiconductor region 144 are not doped may overlap with the n-type semiconductor region 126 at least in the plan view, but it is particularly preferable that the region has its center coinciding with, or at least includes the center of the n-type semiconductor region 126 in the plan view.

As described above, according to the present embodiment, it is possible to reduce the noise caused by the dark current generated in the strong electric field region in the photoelectric conversion element.

Fourth Embodiment

Figure 13:
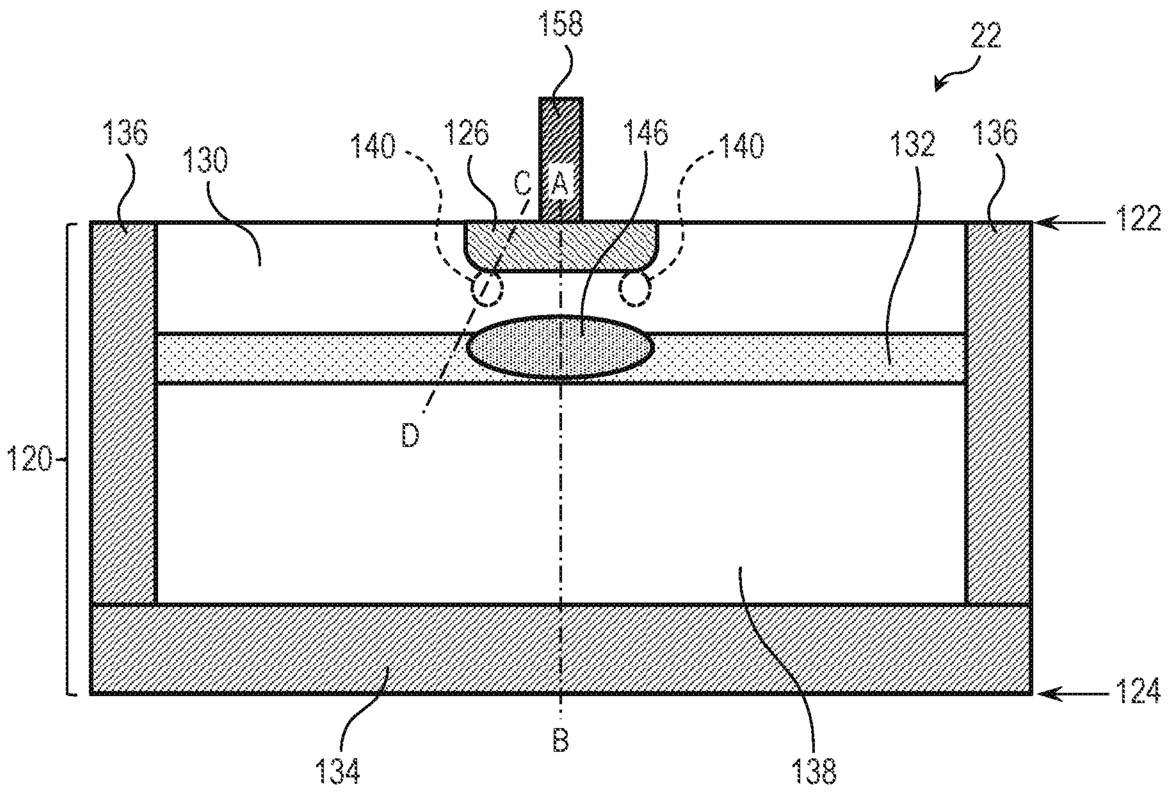
FIG. 13 is a schematic cross-sectional view illustrating a structure of a photoelectric conversion device according to a fourth embodiment of the present invention.

A photoelectric conversion device according to a fourth embodiment of the present invention will be described with reference to FIG. 13. FIG. 13 is a schematic cross-sectional view illustrating a structure of a photoelectric conversion element in the photoelectric conversion device according to the present embodiment. Components similar to those of the photoelectric conversion devices according to the first to third embodiments are denoted by the same reference numerals, and description thereof will be omitted or simplified.

The photoelectric conversion device according to the present embodiment is the same as the photoelectric conversion device according to the first embodiment except that the configuration of the photoelectric conversion element 22 is different. In the present embodiment, differences from the photoelectric conversion element of the first embodiment will be mainly described, and description of the same portions as those of the first embodiment will be appropriately omitted.

As illustrated in FIG. 13, the photoelectric conversion element 22 of the photoelectric conversion device according to the present embodiment includes a p-type semiconductor region 146 instead of the n-type semiconductor region 128. The p-type semiconductor region 146 has substantially the same shape as the n-type semiconductor region 126 in the plan view. The peak of the impurity density distribution of the p-type impurities forming the p-type semiconductor region 146 in the cross-sectional view is located in the p-type semiconductor region 132 closer to the first surface 122 than the peak position of the p-type impurities forming the p-type semiconductor region 132. That is, it can be said that the anode of the photoelectric conversion element 22 is formed of two impurity regions having different impurity profiles, i.e., the p-type semiconductor region 132 and the p-type semiconductor region 146. When compared with the impurity doping amount per unit area, the dose of the p-type impurities for forming the p-type semiconductor region 146 is smaller than the dose of the p-type impurities for forming the p-type semiconductor region 132. When the p-type semiconductor regions 132 and 146 configured as described above are considered as one p-type semiconductor region, a portion of the p-type semiconductor region facing the n-type semiconductor region 126 has a convex shape, and is substantially the same shape as the p-type semiconductor region 132 in the third embodiment. Therefore, according to the p-type semiconductor regions 132 and 146 of the present embodiment as well, similarly to the p-type semiconductor region 132 of the third embodiment, the electric field intensity immediately below the cathode may be made uniform, and the electric field intensity of the region 140 may be reduced.

The p-type semiconductor region 146 may be formed by ion implantation of p-type impurities using a mask having an opening in a predetermined region. By using a dedicated mask for forming the p-type semiconductor region 146, the area of the p-type semiconductor region 146 in the plan view may be set independently of the area of the cathode (n-type semiconductor region 126). On the other hand, when the area of the cathode is small to some extent, specifically, when the area of the cathode is about 2 $\mu m^2$ or less, the cathode and the p-type semiconductor region 146 are optimally formed at the same location. In this case, the n-type semiconductor region 126 and the p-type semiconductor region 146 may be formed using a mask for forming the n-type semiconductor region 126. By using the mask for forming the n-type semiconductor region 126, positional displacement between the n-type semiconductor region 126 and the p-type semiconductor region 146 may be prevented and variation in characteristics may be suppressed. In addition, since it is not necessary to add a mask process for forming the p-type semiconductor region 146, the manufacturing cost does not increase.

As described above, according to the present embodiment, it is possible to reduce the noise caused by the dark current generated in the strong electric field region in the photoelectric conversion element.

Fifth Embodiment

Figure 14:
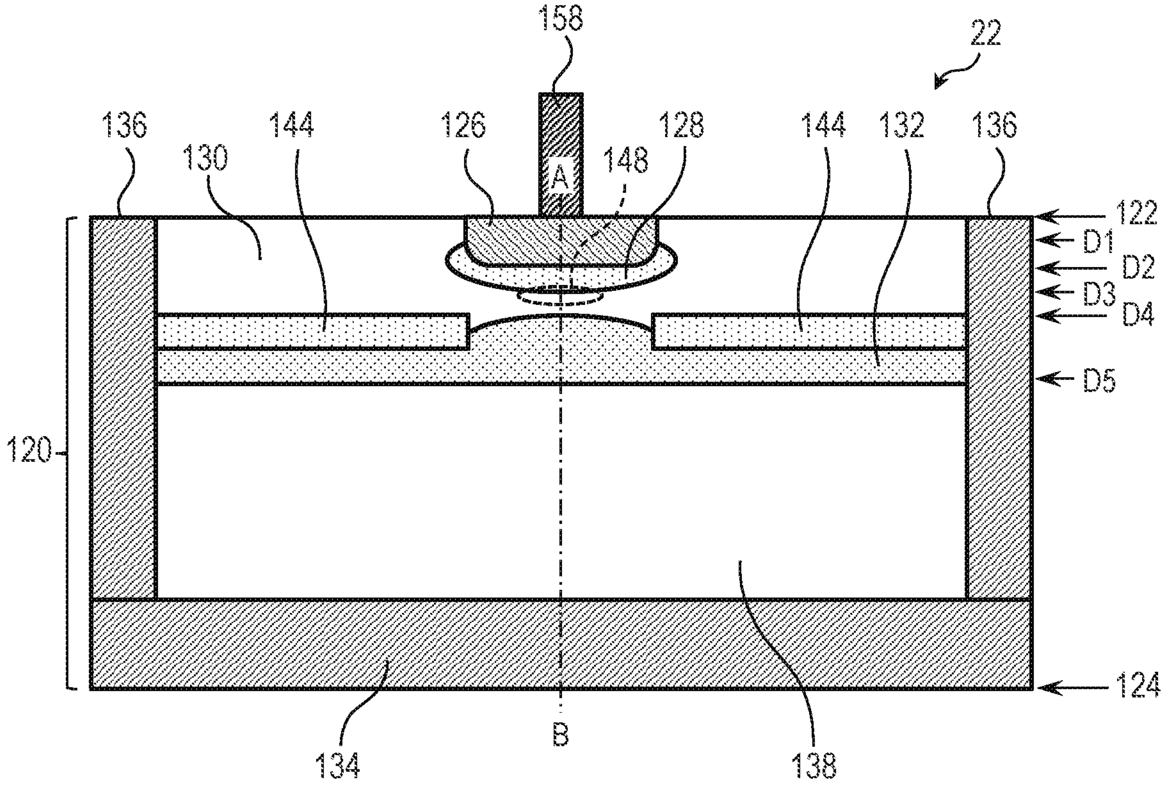
FIG. 14 is a schematic cross-sectional view illustrating a structure of a photoelectric conversion device according to a fifth embodiment of the present invention.

A photoelectric conversion device according to a fifth embodiment of the present invention will be described with reference to FIG. 14. FIG. 14 is a schematic cross-sectional view illustrating a structure of a photoelectric conversion element in the photoelectric conversion device according to the present embodiment. Components similar to those of the photoelectric conversion devices according to the first to fourth embodiments are denoted by the same reference numerals, and description thereof will be omitted or simplified.

The photoelectric conversion device according to the present embodiment is the same as the photoelectric conversion device according to the first embodiment except that the configuration of the photoelectric conversion element 22 is different. In the present embodiment, differences from the photoelectric conversion element of the first embodiment will be mainly described, and description of the same portions as those of the first embodiment will be appropriately omitted.

The configurations described in the first to fourth embodiments may be arbitrarily combined. FIG. 14 illustrates an example in which the first embodiment and the third embodiment are combined as the photoelectric conversion element 22 according to the present embodiment. A region 148 represents the maximum electric field intensity portion in this configuration. In this configuration, the maximum electric field intensity portion moves from the region 140 beneath the peripheral edge of the cathode to the region 148 beneath the center of the cathode, and the electric field intensity at the lower portion of the cathode is made more uniform.

The effect of uniformizing the electric field intensity in the lower portion of the cathode in the first to fourth embodiments is obtained because the cathode is convex downward in the center portion and the portion of the anode facing the cathode is convex upward. However, in order to obtain a sufficient effect, the convex portion of the cathode or anode needs to have a sufficient curvature.

In order to quantitatively study the conditions for obtaining the above effect, the positional relationship between the anode and the cathode is defined as follows. First, the boundary surface of the cathode is defined by the boundary surface on the side of the second surface 124 of the n-type semiconductor region 126. However, in the case where the n-type semiconductor region 128 or the n-type semiconductor region 142 is provided, the n-type semiconductor region 126 and the n-type semiconductor regions 128, 142 are treated as an integrated cathode to define the boundary surface.

Similarly, the boundary surface of the anode is defined by the boundary surface on the side of the first surface 122 of the p-type semiconductor region 132. However, when the p-type semiconductor region 146 is provided, the p-type semiconductor region 132 and the p-type semiconductor region 146 are treated as an integrated anode to define the boundary surface.

When the impurity profile is controlled by the impurity of the opposite conductivity type as in the third embodiment, the boundary surface is defined by using the net impurity density obtained by subtracting the impurity density of the opposite conductivity type. For example, for the p-type semiconductor region 132 of the third embodiment, the boundary surface of the p-type semiconductor region 132 is defined by a net p-type impurity density obtained by subtracting the impurity density of the n-type semiconductor region 144 from the impurity density of the p-type semiconductor region 132.

Note that, although there is a case that the cathode and anode are formed with impurities of different conductivity types and their impurity distributions may overlap at a tail portion, the boundary surfaces between the cathode and anode are not defined by the impurity density obtained by subtracting the impurity density of the other. This is because the overlap of the impurity distributions between the cathode and the anode occurs mainly at the convex portions, but if the boundary surfaces are defined by the impurity density obtained by subtracting the impurity density of the other, the boundary surfaces of the convex portions may collapse, and the structure definition may not be effective. If there is an overlap in the impurity distribution between the cathode and the anode, the electric field intensity at that portion becomes strong, and therefore, even if there is an overlap, the above-described effect is not lost.

The distance between the cathode and anode may be minimized at the center of the cathode. Here, the distance between the cathode and the anode at the center of the cathode is referred to as a minimum distance. It is considered that the distance from the center to the end of the cathode in the plan view is represented by a radius of the cathode by assuming a circular shape in the plan view. It is considered that the end of the cathode in the plan view is an end of a region where the n-type impurities for forming the cathode are introduced. When the planar shape of the cathode is a shape different from a circle, such as a polygon, the average distance from the center to the end portion is assumed to be the radius of the cathode. It is preferable that the difference between the distance between the cathode and the anode at a position separated from the center of the cathode by a distance corresponding to ⅘ of the cathode radius in the plan view and the minimum distance is equal to or greater than 1/10 of the cathode radius. The reason why the cathode radius is defined at a position of ⅘ of the cathode radius is that, when the cathode radius is defined at the position of the cathode radius, there is a possibility that the position dependency of the pure cathode-anode distance due to the convex portion of the cathode center portion cannot be grasped due to the influence of the curvature of the corner shape of the cathode end.

For example, when the radius of the cathode is 0.6 μm, the difference between the minimum distance between the cathode and the anode and the distance between the cathode and the anode at a position separated from the center of the cathode by a distance corresponding to ⅘ of the radius is 0.06 μm or more.

The quantification method of the shape as described above is not necessarily easy to determine in the actual photoelectric conversion element 22. A more practical quantification method in the first to fourth embodiments will now be described.

In the first and second embodiments, the n-type impurity distribution in the depth direction at the center of the cathode may be defined such that the distance from the impurity density of $1\times10^{17}$ cm$^{-3}$ to $1\times10^{16}$ cm$^{-3}$ is 0.18 μm or more.

With respect to the third embodiment, it may be defined that the n-type impurities are not introduced into the tail portion of the side of the first surface 122 of the p-type semiconductor region 132 at the cathode center portion, but the n-type impurities exceeding $5\times10^{15}$ cm$^{-3}$ are introduced into the region excluding the cathode center portion.

In the fourth embodiment, with respect to the p-type semiconductor region constituting the anode, it may be defined that the dose per unit area of the p-type impurity introduced into the portion other than the portion facing the cathode is equal to or less than 9/10 of the dose per unit area of the p-type impurity introduced into the portion facing the cathode.

By configuring the photoelectric conversion element 22 that satisfies the above condition, the electric field intensity in the region 140 where the electric field intensity becomes maximum may be reduced while making the electric field intensity beneath the cathode uniform as a whole. Thereby, it is possible to reduce a dark output with the strong electric field region under the cathode as a generation source.

As described above, according to the present embodiment, it is possible to reduce the noise caused by the dark current generated in the strong electric field region in the photoelectric conversion element.

Sixth Embodiment

Figure 15:
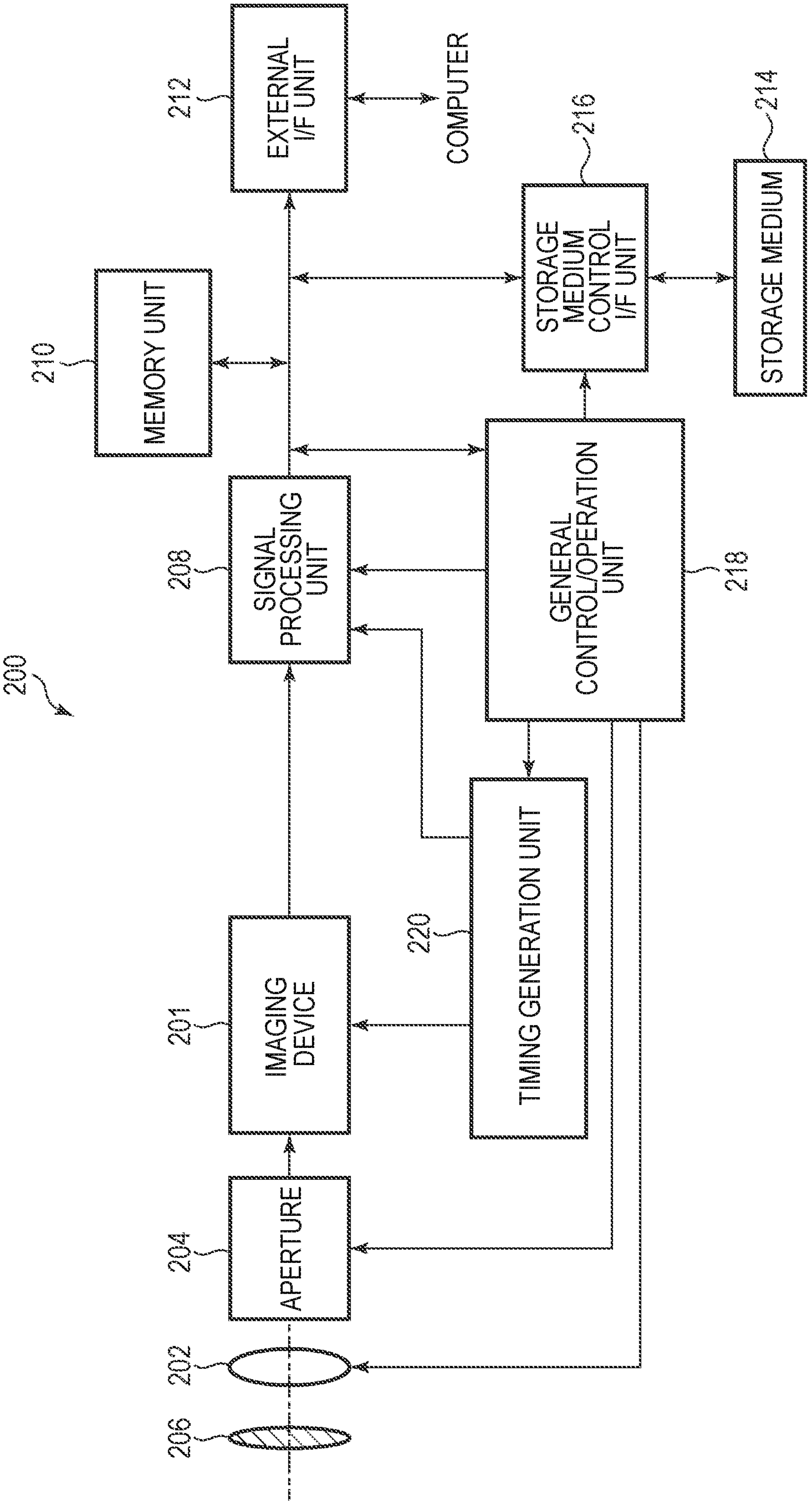
FIG. 15 is a block diagram illustrating a schematic configuration of a photodetection system according to a sixth embodiment of the present invention.

A photodetection system according to a sixth embodiment of the present invention will be described with reference to FIG. 15. FIG. 15 is a block diagram illustrating a schematic configuration of the photodetection system according to the present embodiment. In the present embodiment, a photodetection sensor to which the photoelectric conversion device 100 according to any one of the first to fifth embodiments is applied will be described.

The photoelectric conversion device 100 described in the first to fifth embodiments may be applied to various photodetection systems. Examples of applicable photodetection systems include imaging systems such as digital still cameras, digital camcorders, surveillance cameras, copying machines, facsimiles, mobile phones, on-vehicle cameras, observation satellites, and the like. A camera module including an optical system such as a lens and an imaging device is also included in the photodetection system. FIG. 15 is a block diagram of a digital still camera as an example of these.

The photodetection system 200 illustrated in FIG. 15 includes a photoelectric conversion device 201, a lens 202 for forming an optical image of an object on the photoelectric conversion device 201, an aperture 204 for varying the amount of light passing through the lens 202, and a barrier 206 for protecting the lens 202. The lens 202 and the aperture 204 are optical systems for focusing light on the photoelectric conversion device 201. The photoelectric conversion device 201 is the photoelectric conversion device 100 described in any of the first to fifth embodiments, and converts the optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various corrections and compressions as necessary to output image data. The photoelectric conversion device 201 may include an AD (Analog to Digital) conversion unit that generates a digital signal to be processed by the signal processing unit 208. The AD conversion unit may be formed on a semiconductor layer (semiconductor substrate) on which the photon detection element of the photoelectric conversion device 201 is formed, or may be formed on a semiconductor layer (semiconductor substrate) different from the semiconductor layer in which the photon detection element of the photoelectric conversion device 201 is formed. The signal processing unit 208 may be formed on the same semiconductor substrate as the photoelectric conversion device 201.

The photodetection system 200 further includes a memory unit 210 for temporarily storing image data, and an external interface unit (external I/F unit) 212 for communicating with an external computer or the like. Further, the photodetection system 200 includes a storage medium 214 such as a semiconductor memory for storing or reading out captured image data, and a storage medium control interface unit (storage medium control I/F unit) 216 for storing or reading out image data on or from the storage medium 214. The storage medium 214 may be built in the photodetection system 200, or may be detachable. Further, communication between the storage medium control I/F unit 216 and the storage medium 214 and communication from the external I/F unit 212 may be performed wirelessly.

Further, the photodetection system 200 includes a general control/operation unit 218 that controls various calculations and the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and a signal processing unit 208 that processes an output signal output from the photoelectric conversion device 201. The timing generation unit 220 may be mounted on the photoelectric conversion device 201. Further, the general control/operation unit 218 and the timing generation unit 220 may be configured to implement some or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform a distance measurement operation on a signal output from the photoelectric conversion device 201.

As described above, according to the present embodiment, by configuring the photodetection system using the photoelectric conversion devices according to any of the first to fifth embodiments, it is possible to realize a photodetection system capable of obtaining a higher quality image.

Seventh Embodiment

Figure 16:
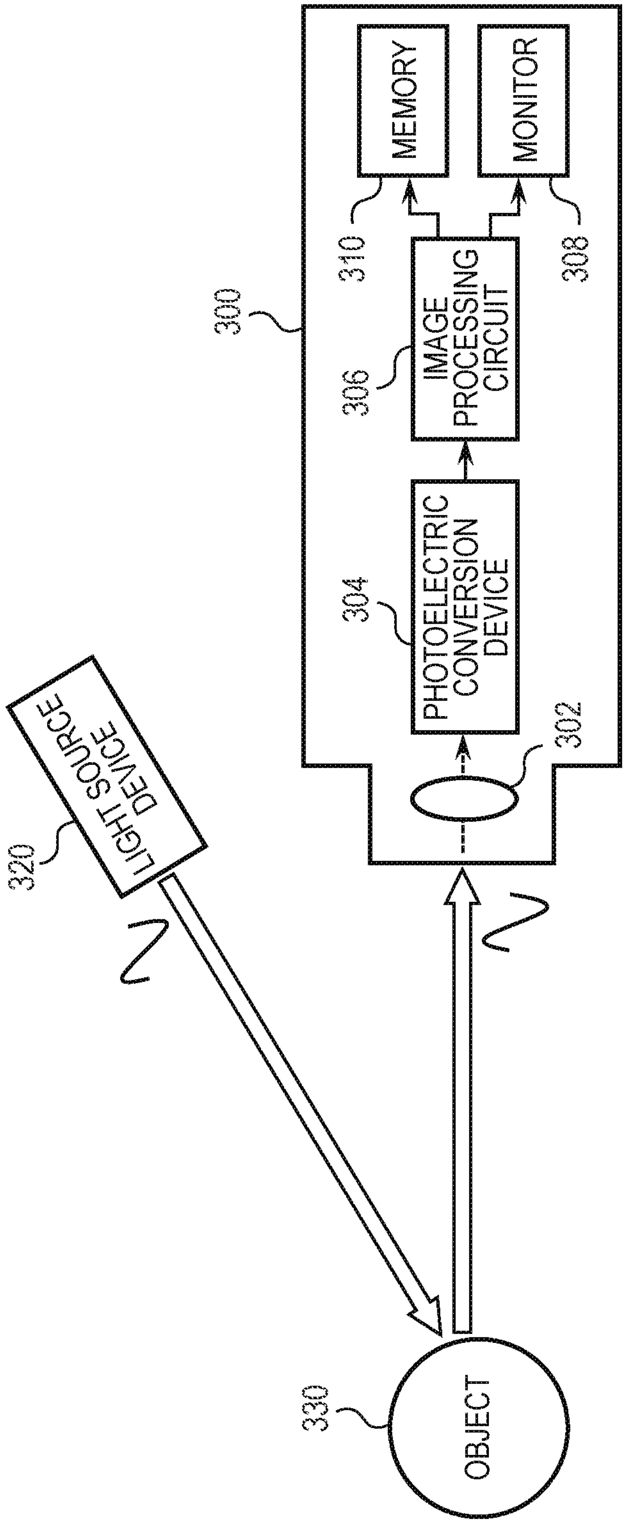
FIG. 16 is a block diagram illustrating a schematic configuration of a range image sensor according to a seventh embodiment of the present invention.

A range image sensor according to a seventh embodiment of the present invention will be described with reference to FIG. 16. FIG. 16 is a block diagram illustrating a schematic configuration of the range image sensor according to the present embodiment. In the present embodiment, a range image sensor will be described as an example of a photodetection system to which the photoelectric conversion device 100 according to any one of the first to fifth embodiments is applied.

As illustrated in FIG. 16, the range image sensor 300 according to the present embodiment may include an optical system 302, a photoelectric conversion device 304, an image processing circuit 306, a monitor 308, and a memory 310. The range image sensor 300 receives light (modulated light or pulse light) emitted from a light source device 320 toward an object 330 and reflected by the surface of the object 330, and acquires a distance image corresponding to the distance to the object 330.

The optical system 302 includes one or a plurality of lenses, and has a role of forming an image of image light (incident light) from the object 330 on a light receiving surface (sensor unit) of the photoelectric conversion device 304.

The photoelectric conversion device 304 is the photoelectric conversion device 100 described in any of the first to fifth embodiments, and has a function of generating a distance signal indicating the distance to the object 330 based on the image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion device according to any of the first to fifth embodiments, it is possible to realize a range image sensor capable of acquiring a distance image including more accurate distance information in conjunction with improvement in characteristics of the pixels 12.

Eighth Embodiment

Figure 17:
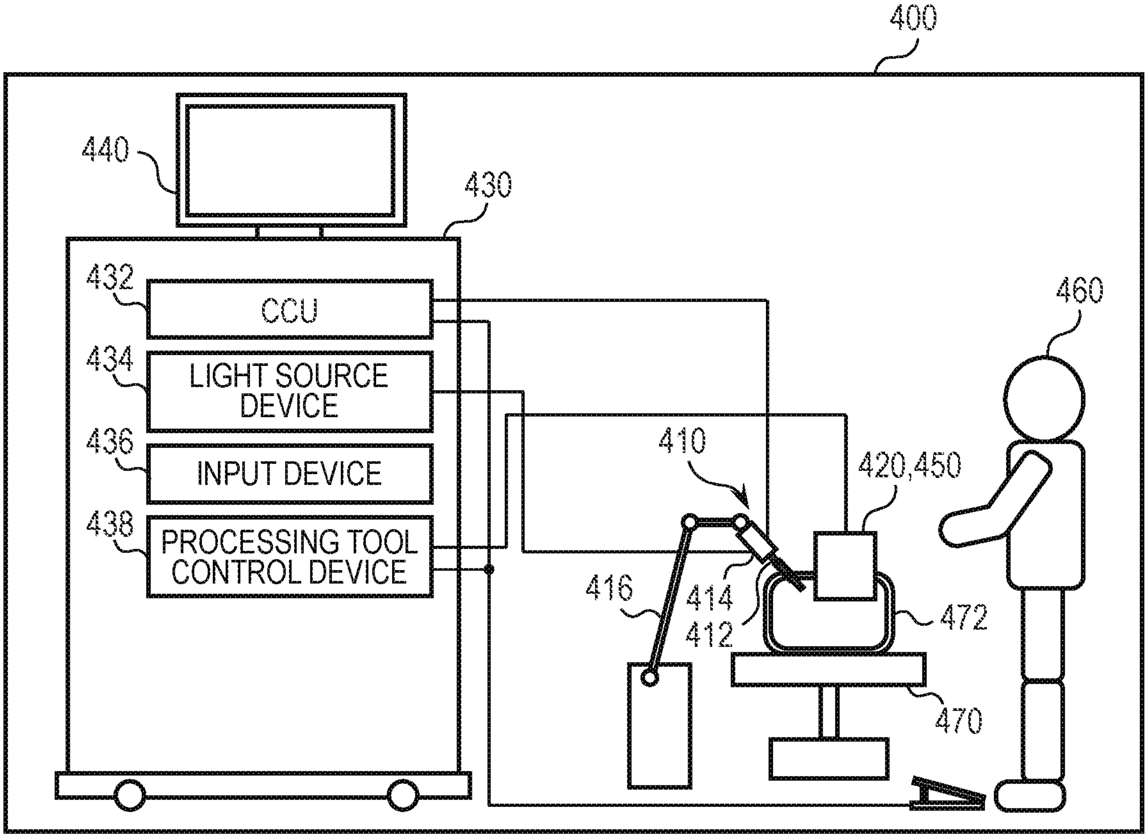
FIG. 17 is a schematic diagram illustrating a configuration example of an endoscopic surgical system according to an eighth embodiment of the present invention.

An endoscopic surgical system according to an eighth embodiment of the present invention will be described with reference to FIG. 17. FIG. 17 is a schematic diagram illustrating a configuration example of the endoscopic surgical system according to the present embodiment. In the present embodiment, an endoscopic surgical system will be described as an example of a photodetection system to which the photoelectric conversion device 100 according to any one of the first to fifth embodiments is applied.

FIG. 17 illustrates a state in which an operator (surgeon) 460 performs a surgery on a patient 472 on a patient bed 470 using an endoscopic surgical system 400.

As illustrated in FIG. 17, the endoscopic surgical system 400 according to the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which an area of a predetermined length from the tip is inserted into the body cavity of the patient 472, and a camera head 414 connected to the base end of the lens barrel 412. Although FIG. 17 illustrates an endoscope 410 configured as a rigid mirror having a rigid lens barrel 412, the endoscope 410 may be configured as a flexible mirror having a flexible lens barrel. The endoscope 410 is held in a movable state by an arm 416.

An opening into which the objective lens is fitted is provided at the tip of the lens barrel 412. The light source device 434 is connected to the endoscope 410, and light generated by the light source device 434 is guided to the tip of the lens barrel 412 by a light guide extended inside the lens barrel 412, and is irradiated to an observation target in the body cavity of the patient 472 via an objective lens. The endoscope 410 may be a direct-viewing mirror, an oblique-viewing mirror, or a side-viewing mirror.

An optical system and a photoelectric conversion device (not illustrated) are provided inside the camera head 414, and reflected light (observation light) from the observation target is focused on the photoelectric conversion device by the optical system.

The photoelectric conversion device photoelectrically converts the observation light and generates an electric signal corresponding to the observation light, i.e., an image signal corresponding to the observation image. As the photoelectric conversion device, the photoelectric conversion device 100 described in any of the first to fifth embodiments may be used. The image signal is transmitted to the CCU 432 as RAW data.

The CCU 432 may be configured by a CPU (Central Processing Unit), a GPU (Graphics Processing Unit), and the like, and integrally controls the operation of the endoscope 410 and the display device 440. Further, the CCU 432 receives an image signal from the camera head 414, and performs various types of image processing for displaying an image based on the image signal, such as development processing (demosaic processing), on the image signal.

The display device 440 displays an image based on the image signal subjected to the image processing by the CCU 432 under the control of the CCU 432.

The light source device 434 may be configured by, for example, a light source such as an LED (Light Emitting Diode), and supplies irradiation light to the endoscope 410 when capturing an image of a surgical part or the like.

The input device 436 is an input interface for the endoscopic surgical system 400. The user may input various kinds of information and instructions to the endoscopic surgical system 400 via the input device 436.

The processing tool control device 438 controls the actuation of the energy processing tool 450 for tissue ablation, incision, blood vessel sealing, etc.

The light source device 434 for supplying the irradiation light to the endoscope 410 when capturing an image of the surgical part may be composed of a white light source composed of, for example, an LED, a laser light source, or a combination thereof. When a white light source is constituted by a combination of RGB laser light sources, since the output intensity and output timing of each color (each wavelength) may be controlled with high accuracy, the white balance of the captured image may be adjusted in the light source device 434. In this case, the observation object is irradiated with the laser light from each of the RGB laser light sources in a time division manner, and the driving of the imaging element of the camera head 414 is controlled in synchronization with the irradiation timing, whereby the images corresponding to the RGB light sources may be captured in a time division manner. According to this method, a color image may be obtained without providing a color filter in the imaging element.

Further, the driving of the light source device 434 may be controlled so as to change the intensity of the output light every predetermined time. By controlling the driving of the imaging element of the camera head 414 in synchronization with the timing of changing the intensity of the light to acquire images in a time-division manner and compositing the images, it is possible to generate an image in a high dynamic range without so-called blocked up shadows and blown out highlights.

The light source device 434 may be configured to be capable of supplying light in a predetermined wavelength band corresponding to the special light observation. In the special light observation, for example, wavelength dependency of light absorption in body tissue is utilized. Specifically, a predetermined tissue such as a blood vessel in the surface layer of the mucosa is imaged with high contrast by irradiating light in a narrower band compared to the irradiation light (i.e., white light) during normal observation. Alternatively, in the special light observation, fluorescence observation for obtaining an image by fluorescence generated by irradiation with excitation light may be performed. In the fluorescence observation, the body tissue may be irradiated with excitation light to observe fluorescence from the body tissue, or a reagent such as indocyanine green (ICG) may be locally poured into the body tissue, and the body tissue may be irradiated with excitation light corresponding to the fluorescence wavelength of the reagent to obtain a fluorescence image. The light source device 434 may be configured to supply narrowband light and/or excitation light corresponding to such special light observation.

As described above, according to the present embodiment, by configuring the endoscopic surgical system using the photoelectric conversion device according to any of the first to fifth embodiments, it is possible to realize an endoscopic surgical system capable of acquiring images of better quality.

Ninth Embodiment

Figure 18A:
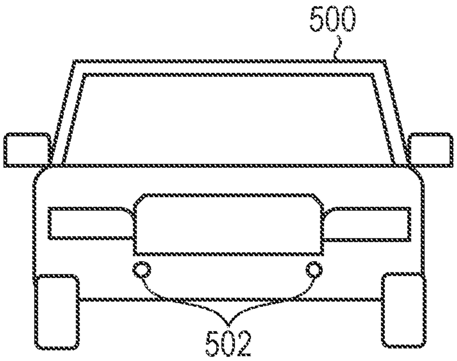
FIG. 18A, FIG. 18B, and FIG. 18C are schematic diagrams illustrating a configuration example of a movable object according to a ninth embodiment of the present invention.
Figure 18B:
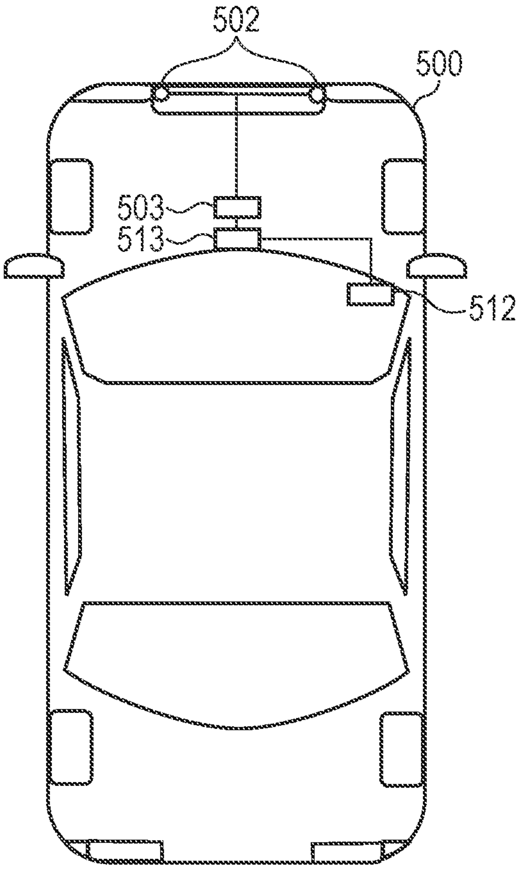
Figure 18C:
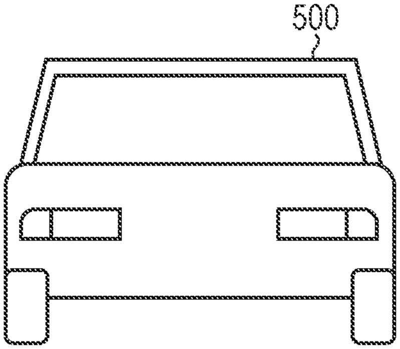
Figure 19:
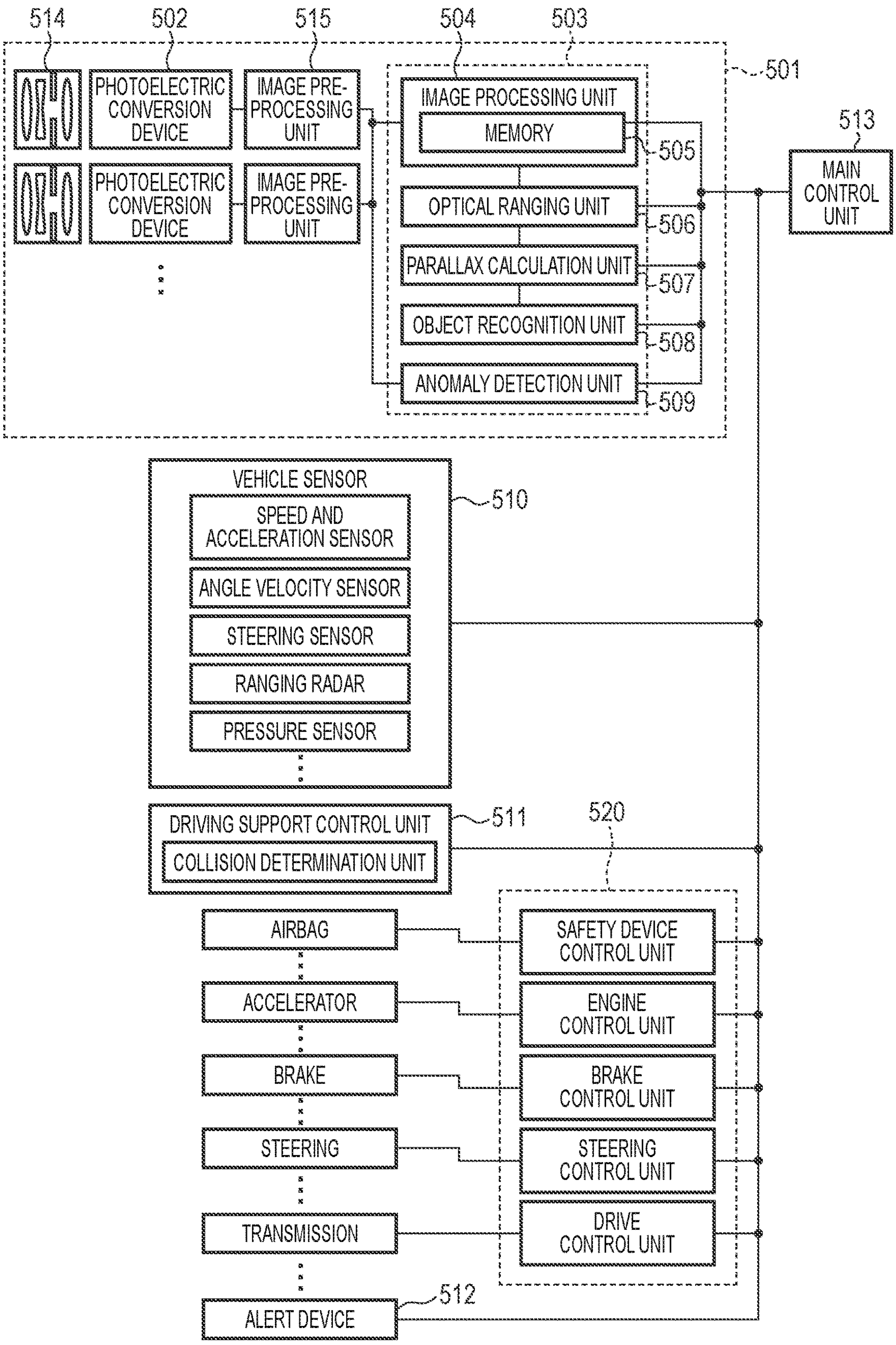
FIG. 19 is a block diagram illustrating a schematic configuration of a photodetection system according to a ninth embodiment of the present invention.
Figure 20:
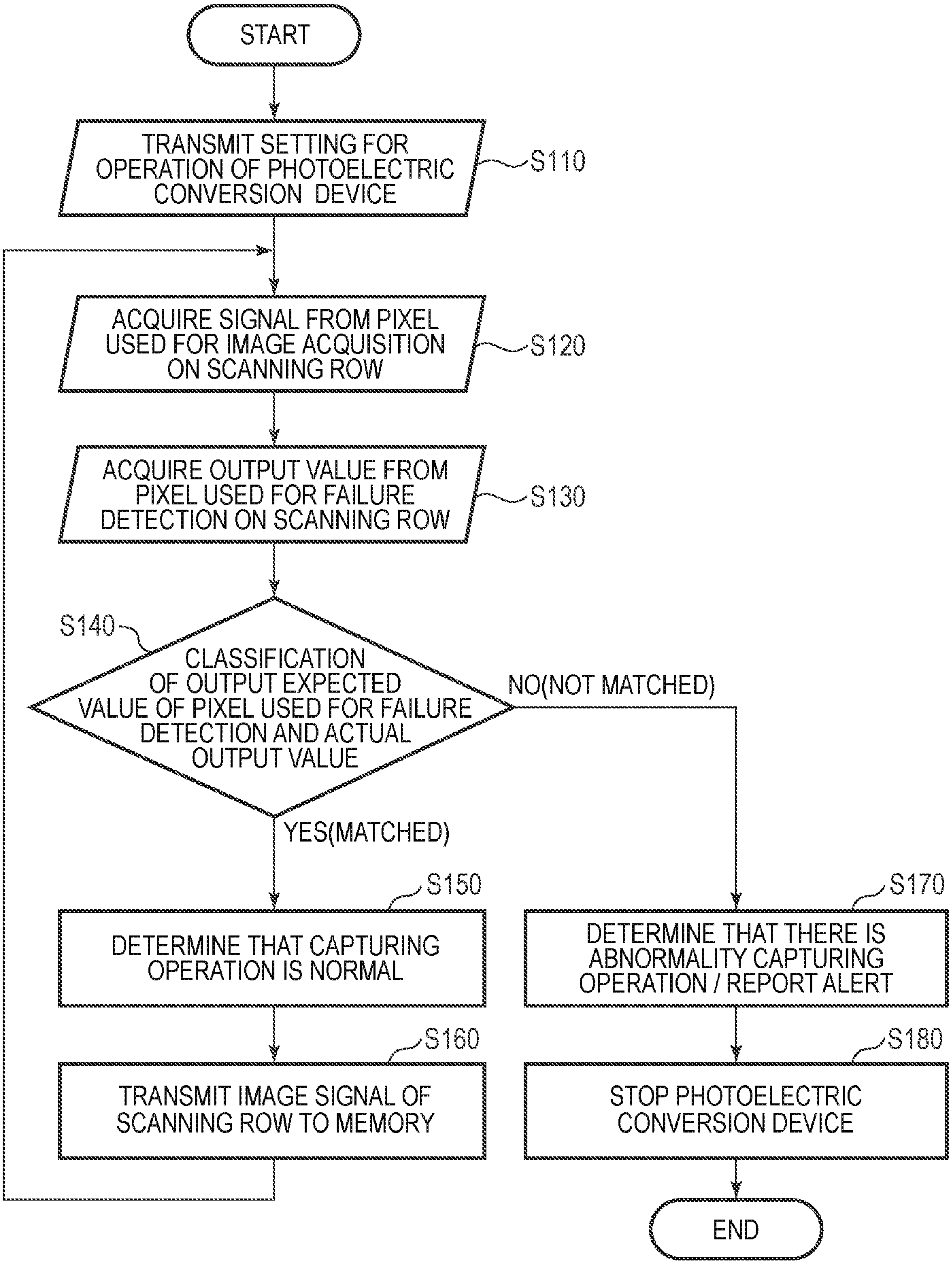
FIG. 20 is a flowchart illustrating an operation of the photodetection system according to the ninth embodiment of the present invention.

A photodetection system and a movable object according to a ninth embodiment of the present invention will be described with reference to FIG. 18A to FIG. 20. FIG. 18A to FIG. 18C are schematic diagrams illustrating a configuration example of a movable object according to the present embodiment. FIG. 19 is a block diagram illustrating a schematic configuration of a photodetection system according to the present embodiment. FIG. 20 is a flowchart illustrating an operation of the photodetection system according to the present embodiment. In the present embodiment, an application example to an on-vehicle camera will be described as a photodetection system to which the photoelectric conversion device 100 according to any one of the first to fifth embodiments is applied.

FIG. 18A to FIG. 18C are schematic diagrams illustrating a configuration example of a movable object (a vehicle system) according to the present embodiment. FIG. 18A to FIG. 18C illustrate a configuration of a vehicle 500 (an automobile) as an example of a vehicle system incorporating a photodetection system to which the photoelectric conversion device 100 according to any one of the first to fifth embodiments is applied. FIG. 18A is a schematic front view of the vehicle 500, FIG. 18B is a schematic plan view of the vehicle 500, and FIG. 18C is a schematic rear view of the vehicle 500. The vehicle 500 includes a pair of photoelectric conversion devices 502 on the front side thereof. Here, the photoelectric conversion devices 502 are the photoelectric conversion device 100 described in any of the first to fifth embodiments. The vehicle 500 includes an integrated circuit 503, an alert device 512, and a main control unit 513.

FIG. 19 is a block diagram illustrating a configuration example of a photodetection system 501 mounted on the vehicle 500. The photodetection system 501 includes a photoelectric conversion device 502, an image preprocessing unit 515, an integrated circuit 503, and an optical system 514. The photoelectric conversion device 502 is the photoelectric conversion device 100 described in any of the first to fifth embodiments. The optical system 514 forms an optical image of an object on the photoelectric conversion device 502. The photoelectric conversion device 502 converts the optical image of the object formed by the optical system 514 into an electric signal. The image preprocessing unit 515 performs predetermined signal processing on the signal output from the photoelectric conversion device 502. The function of the image preprocessing unit 515 may be incorporated in the photoelectric conversion device 502. The photodetection system 501 is provided with at least two sets of the optical system 514, the photoelectric conversion device 502, and the image preprocessing unit 515, and outputs from the image preprocessing units 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an abnormality detection unit 509. The image processing unit 504 processes the image signal output from the image preprocessing unit 515. For example, the image processing unit 504 performs image processing such as development processing and defect correction on the output signal of the image preprocessing unit 515. The image processing unit 504 includes a memory 505 for temporarily storing image signals. The memory 505 may store, for example, the position of a known defective pixel in the photoelectric conversion device 502.

The optical ranging unit 506 performs focusing and distance measurement of the object. The parallax calculation unit 507 calculates distance measurement information (distance information) from a plurality of image data (parallax images) acquired by the plurality of photoelectric conversion devices 502. Each of the photoelectric conversion devices 502 may have a configuration capable of acquiring various kinds of information such as distance information. The object recognition unit 508 recognizes an object such as a vehicle, a road, a sign, or a person.

When the abnormality detection unit 509 detects an abnormality of the photoelectric conversion device 502, the abnormality detection unit 509 notifies the main control unit 513 of the abnormality.

The integrated circuit 503 may be implemented by dedicated hardware, software modules, or a combination thereof. Further, it may be implemented by FPGA (Field Programmable Gate Array), ASIC (Application Specific Integrated Circuit), or the like, or may be implemented by a combination of these.

The main control unit 513 collectively controls the operations of the photodetection system 501, the vehicle sensor 510, the control unit 520, and the like. The vehicle 500 may not include the main control unit 513.

In this case, the photoelectric conversion device 502, the vehicle sensor 510, and the control unit 520 transmit and receive control signals via a communication network. For example, the CAN (Controller Area Network) standard may be applied to transmit and receive the control signals.

The integrated circuit 503 has a function of receiving a control signal from the main control unit 513 or transmitting a control signal and a setting value to the photoelectric conversion device 502 by its own control unit.

The photodetection system 501 is connected to the vehicle sensor 510, and may detect a traveling state of the own vehicle such as a vehicle speed, a yaw rate, a steering angle, and the like, an environment outside the own vehicle, and states of other vehicles and obstacles.

The vehicle sensor 510 is also a distance information acquisition means for acquiring distance information to the object. The photodetection system 501 is connected to a driving support control unit 511 that performs various driving support functions such as an automatic steering function, an automatic cruising function, and a collision prevention function. In particular, with regard to the collision determination function, based on the detection results of the photodetection system 501 and the vehicle sensor 510, it is determined whether or not there is a collision with another vehicle or an obstacle. Thus, avoidance control when a collision is estimated and activation of the safety device at the time of collision are performed.

The photodetection system 501 is also connected to an alert device 512 that issues an alert to the driver based on the determination result of the collision determination unit. For example, when the collision possibility is high as the determination result of the collision determination unit, the main control unit 513 performs vehicle control to avoid collision and reduce damage by braking, returning an accelerator, suppressing engine output, or the like. The alert device 512 alerts a user by sounding an alarm such as a sound, displaying alert information on a display screen of a car navigation system or a meter panel, or applying vibration to a seat belt or a steering wheel.

In the present embodiment, the photodetection system 501 images the periphery of the vehicle, for example, the front side or the rear side. FIG. 18B illustrates an example of the arrangement of the photodetection system 501 when the photodetection system 501 captures an image in front of the vehicle.

As described above, the photoelectric conversion device 502 is disposed in front of the vehicle 500. More specifically, when a center line with respect to a forward/backward direction of the vehicle 500 or an outer shape (e.g., a vehicle width) is regarded as a symmetry axis, and two photoelectric conversion devices 502 are disposed axisymmetrically with respect to the symmetry axis, it is preferable to acquire distance information between the vehicle 500 and an object to be imaged and to determine a collision possibility. Further, it is preferable that the photoelectric conversion device 502 is disposed so as not to obstruct the field of view of the driver when the driver sees a situation outside the vehicle 500 from the driver's seat. The alert device 512 is preferably arranged to be easy to enter the field of view of the driver.

Next, a failure detection operation of the photoelectric conversion device 502 in the photodetection system 501 will be described with reference to FIG. 20. The failure detection operation of the photoelectric conversion device 502 may be performed according to steps S110 to S180 illustrated in FIG. 20.

Step S110 is a step of performing setting at the time of startup of the photoelectric conversion device 502. That is, a setting for the operation of the photoelectric conversion device 502 is transmitted from the outside of the photodetection system 501 (for example, the main control unit 513) or from the inside of the photodetection system 501, and the imaging operation and the failure detection operation of the photoelectric conversion device 502 are started.

Next, in step S120, pixel signals are acquired from the effective pixels. In step S130, an output value from the failure detection pixel provided for failure detection is acquired. The failure detection pixel includes a photoelectric conversion element as in the case of the effective pixels. A predetermined voltage is written to the photoelectric conversion element. The failure detection pixel outputs a signal corresponding to the voltage written to the photoelectric conversion element. Step S120 and step S130 may be reversed.

Next, in step S140, a classification of the output expected value of the failure detection pixel and the actual output value from the failure detection pixel is performed. As a result of the classification in step S140, when the output expected value matches the actual output value, the process proceeds to step S150, it is determined that the imaging operation is normally performed, and the process proceeds to step S160. In step S160, the pixel signals of the scanning row are transmitted to the memory 505 to temporarily store them. After that, the process returns to step S120 to continue the failure detection operation. On the other hand, as a result of classification in step S140, when the output expected value does not match the actual output value, the processing step proceeds to step S170. In step S170, it is determined that there is an abnormality in the imaging operation, and an alert is notified to the main control unit 513 or the alert device 512. The alert device 512 causes the display unit to display that an abnormality has been detected. Thereafter, in step S180, the photoelectric conversion device 502 is stopped, and the operation of the photodetection system 501 is terminated.

Although the present embodiment exemplifies the example in which the flowchart is looped for each row, the flowchart may be looped for each plurality of rows, or the failure detection operation may be performed for each frame. The alert of step S170 may be notified to the outside of the vehicle via the wireless network.

Further, in the present embodiment, the control in which the own vehicle does not collide with other vehicles has been described, but the present invention is also applicable to a control in which the own vehicle is automatically driven following another vehicle, a control in which the own vehicle is automatically driven so as not to go out of the lane, and the like. Further, the photodetection system 501 may be applied not only to a vehicle such as an own vehicle but also to, for example, other movable objects (moving devices) such as a ship, an aircraft, or an industrial robot. In addition, the present invention may be applied not only to a movable object but also to equipment using object recognition in a wide range such as an ITS (Intelligent Transport Systems).

Tenth Embodiment

Figure 21A:
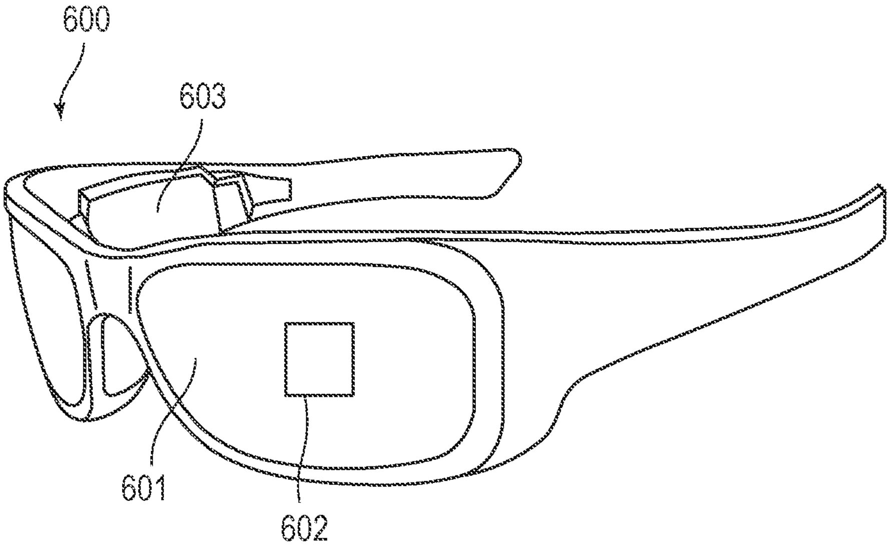
FIG. 21A and FIG. 21B are schematic diagrams illustrating a schematic configuration of a photodetection system according to a tenth embodiment of the present invention.
Figure 21B:
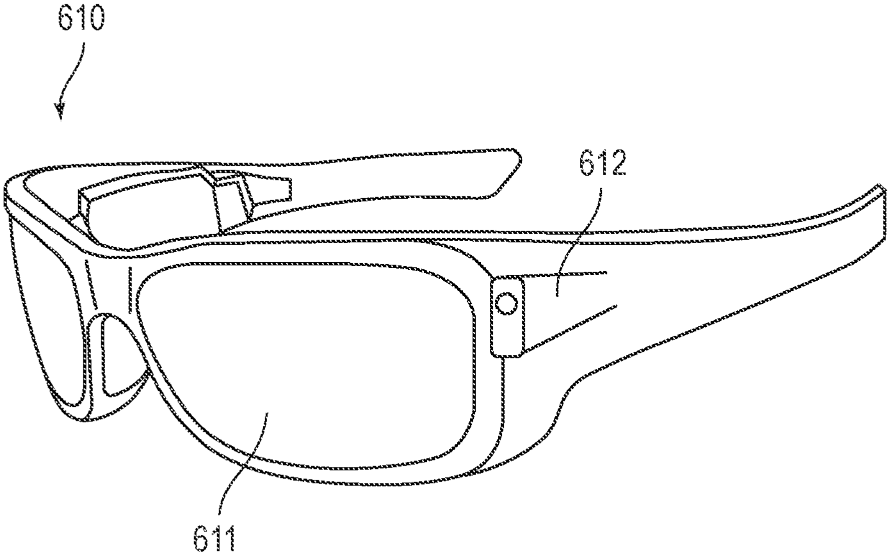

A photodetection system according to a tenth embodiment of the present invention will be described with reference to FIG. 21A and FIG. 21B. FIG. 21A and FIG. 21B are schematic diagrams illustrating a configuration example of a photodetection system according to the present embodiment. In the present embodiment, an application example to eyeglasses (smartglasses) will be described as a photodetection system to which the photoelectric conversion device 100 according to any one of the first to fifth embodiments is applied.

FIG. 21A illustrates eyeglasses 600 (smartglasses) according to one application example. The eyeglasses 600 include lenses 601, a photoelectric conversion device 602, and a control device 603.

The photoelectric conversion device 602 is the photoelectric conversion device 100 described in any of the first to fifth embodiments, and is provided on the lens 601. One photoelectric conversion device 602 or a plurality of photoelectric conversion devices 602 may be provided on the lens 601. When the plurality of photoelectric conversion devices 602 is used, a plurality of types of photoelectric conversion devices 602 may be used in combination. The arrangement position of the photoelectric conversion device 602 is not limited to that illustrated in FIG. 21A. A display device (not illustrated) including a light emitting device such as an OLED or an LED may be provided on the rear surface side of the lens 601.

The control device 603 functions as a power supply for supplying power to the photoelectric conversion device 602 and the display device. The control device 603 has a function of controlling the operation of the photoelectric conversion device 602 and the display device. The lens 601 is provided with an optical system for focusing light on the photoelectric conversion device 602.

FIG. 21B illustrates eyeglasses 610 (smartglasses) according to another application example. The eyeglasses 610 include lenses 611 and a control device 612. A photoelectric conversion device corresponding to the photoelectric conversion device 602 and a display device (not illustrated) may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operation of the photoelectric conversion device and the display device.

The control device 612 may further include a line-of-sight detection unit that detects the line of sight of the wearer. In this case, an infrared light emitting unit is provided in the control device 612, and infrared light emitted from the infrared light emitting unit may be used for detection of a line of sight. Specifically, the infrared light emitting unit emits infrared light to the eyeball of the user who is watching the display image. The reflected light of the emitted infrared light from the eyeball is detected by the imaging unit having the light receiving element, whereby a captured image of the eyeball is obtained. By providing a reduction unit that reduces light from the infrared light emitting unit to the display unit in a plan view, a decrease in image quality may be reduced.

The line of sight of the user with respect to the display image may be detected from the captured image of the eyeball obtained by capturing the infrared light. Any known method may be applied to the line-of-sight detection using the captured image of the eyeball. As an example, a line-of-sight detection method based on a Purkinje image caused by reflection of irradiation light on the cornea may be used. More specifically, a line-of-sight detection processing based on the pupil cornea reflection method is performed. By using the pupil cornea reflection method, a line-of-sight vector representing the direction (rotation angle) of the eyeball is calculated based on the image of the pupil image and the Purkinje image included in the captured image of the eyeball, whereby the line-of-sight of the user is detected.

The display device according to the present embodiment may include a photoelectric conversion device having a light receiving element, and may be configured to control a display image based on line-of-sight information of a user from the photoelectric conversion device. Specifically, the display device determines a first viewing area to be gazed by the user and a second viewing area other than the first viewing area based on the line-of-sight information. The first viewing area and the second viewing area may be determined by a control device of the display device, or may be determined by an external control device. When an external control device determines, the determination result is transmitted to the display device via communication. In the display region of the display device, the display resolution of the first viewing area may be controlled to be higher than the display resolution of the second viewing area. That is, the resolution of the second viewing area may be lower than the resolution of the first viewing area.

Further, the display area may have a first display area and a second display area different from the first display area, and may be configured to determine an area having a high priority from the first display area and the second display area based on the line-of-sight information. The first display area and the second display area may be determined by a control device of the display device, or may be determined by an external control device. When an external control device determines, the determination result is transmitted to the display device via communication. The resolution of the area with high priority may be controlled to be higher than the resolution of the area other than the area with high priority. That is, the resolution of the area having a relatively low priority may be reduced.

An AI (Artificial Intelligence) may be used to determine the first viewing area or the area with high priority. The AI may be a model configured to estimate an angle of a line-of-sight and a distance to a target object ahead of the line-of-sight from an image of an eyeball, using an image of the eyeball and a direction in which the eyeball of the image is actually viewed as teacher data. The AI program may be held by the display device, the photoelectric conversion device, or an external device. When the external device has, the information is transmitted to the display device via communication.

When the display control is performed based on the visual recognition detection, the present invention may be preferably applied to smartglasses which further include a photoelectric conversion device for capturing an image of the outside. The smartglasses may display captured external information in real time.

MODIFIED EMBODIMENTS

The present invention is not limited to the above embodiment, and various modifications are possible.

For example, an example in which some of the configurations of any of the embodiments are added to other embodiments or an example in which some of the configurations of any of the embodiments are substituted with some of the configurations of the other embodiments is also an embodiment of the present invention.

Further, in the above-described embodiments, a configuration in which light to be detected is incident from the side of the second surface 124 of the semiconductor layer 120, that is, a so-called back-illuminated-type photoelectric conversion device is described, but the photoelectric conversion device may be configured such that light to be detected is incident from the side of the first surface 122 of the semiconductor layer 120.

Further, in the above-described embodiments, the distance between the boundary surface of the n-type semiconductor region 126 and the boundary surface of the p-type semiconductor region 132 in the center portion of the n-type semiconductor region 126 in the plan view is made shortest. However, the location where the distance between the boundary surface of the n-type semiconductor region 126 and the boundary surface of the p-type semiconductor region 132 is shortest may not necessarily be the strict center of the n-type semiconductor region 126 in the plan view. Even if the position where the distance between the boundary surface of the n-type semiconductor region 126 and the boundary surface of the p-type semiconductor region 132 is the shortest is slightly shifted from the center portion of the n-type semiconductor region 126 in the plan view, the effect of the present invention may be obtained.

The circuit configuration of the pixel 12 is not limited to the above-described embodiments. For example, a switch such as a transistor may be provided between the photoelectric conversion element 22 and the quenching element 24 or between the photoelectric conversion unit 20 and the pixel signal processing unit 30 to control an electrical connection state therebetween. Further, a switch such as a transistor may be provided between the node to which the voltage VH is supplied and the quenching element 24 and/or between the node to which the voltage VL is supplied and the photoelectric conversion element 22 to control an electrical connection state therebetween. Further, a plurality of photoelectric conversion elements 22 may be provided for one pixel 12.

Although the counter circuit 34 is used as the pixel signal processing unit 30 in the above-described embodiments, a TDC (Time-to-Digital Converter) and a memory may be used instead of the counter circuit 34. In this case, the generation timing of the pulse signal output from the waveform shaping unit 32 is converted into a digital signal by the TDC. A control pulse pREF (reference signal) is supplied from the vertical scanning circuit unit 40 to the TDC via the control line 14 when the timing of the pulse signal is measured. The TDC acquires a signal as a digital signal when the input timing of the signal output from each pixel 12 is set to a relative time with reference to the control pulse pREF.

It should be noted that any of the above-described embodiments is merely an example of an embodiment for carrying out the present invention, and the technical scope of the present invention should not be construed as being limited thereto. That is, the present invention can be implemented in various forms without departing from the technical idea or the main features thereof.

According to the present invention, it is possible to reduce noise caused by a dark current generated in a strong electric field region in a photoelectric conversion element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-005910, filed Jan. 18, 2023, which is hereby incorporated by reference herein in its entirety.

What is claimed is:

1. A photoelectric conversion element provided in a semiconductor layer including a first surface and a second surface opposed to the first face comprising:
  - a first semiconductor region of a first conductivity type disposed in contact with the first surface;
  - a second semiconductor region of a second conductivity type disposed closer to the second surface than the first semiconductor region; and
  - a third semiconductor region disposed closer to the second surface than the second semiconductor region,
  - wherein the first semiconductor region and the second semiconductor region constitute an avalanche photodiode, and the avalanche photodiode is configured to multiply a signal charge generated in the third semiconductor region, and
  - wherein a distance between a boundary surface on a side of the second semiconductor region of the first semiconductor region and a boundary surface on a side of the first semiconductor region of the second semiconductor region is minimum at a first portion positioned at a center portion of the first semiconductor region in a plan view, and the distance at a second portion different from the first portion is wider than the distance at the first portion.

2. The photoelectric conversion element according to claim 1,
  - wherein a difference between a first interval between the boundary surface of the first semiconductor region and the boundary surface of the second semiconductor region at the first portion and a second interval between the boundary surface of the first semiconductor region and the boundary surface of the second semiconductor region at a portion separated from the center portion by an interval corresponding to ⅘ of a radius of the first semiconductor region is equal to or greater than 1⁄10 of the radius.

3. The photoelectric conversion element according to claim 1, wherein the first semiconductor region includes a first impurity region in contact with the first surface and having a peak of an impurity density distribution at a first depth, and a second impurity region disposed in a region including the first portion in the plan view and having a peak of an impurity density distribution at a second depth on a side of the second surface with respect to the first depth.

4. The photoelectric conversion element according to claim 3,
  - wherein the first impurity region and the second impurity region have the same shape in the plan view, and
  - wherein the second impurity region has a lower impurity density than the first impurity region, and has a peak of the impurity density distribution at a tail portion on the side of the second surface of the first impurity region.

5. The photoelectric conversion element according to claim 3, wherein the second impurity region has an area in the plan view smaller than the first impurity region, and is locally provided in a region including the first portion.

6. The photoelectric conversion element according to claim 5, wherein an area of the second impurity region in the plan view is equal to or less than ⅙ of an area of the first impurity region in the plan view.

7. The photoelectric conversion element according to claim 5, wherein the second impurity region has a peak of the impurity density distribution between the first depth and a boundary surface on the side of the second surface of the first impurity region.

8. The photoelectric conversion element according to claim 1, wherein the first semiconductor region has a distance in the first portion where the impurity density of the first conductivity type is changed from $1\times10^{17}$ $cm^{-3}$ to $1\times10^{16}$ $cm^{-3}$ is 0.18 μm or more.

9. The photoelectric conversion element according to claim 1, wherein a space between a boundary surface on a side of the first surface of the second semiconductor region and the first surface in a first region overlapping with the first semiconductor region in the plan view is narrower than a space between a boundary surface on a side of the first surface of the second semiconductor region and the first surface in a second region not overlapping with the first semiconductor region in the plan view.

10. The photoelectric conversion element according to claim 9, further comprising: a fourth semiconductor region of the first conductivity type disposed in a tail portion of the second semiconductor region on a side of the first surface in the second region,
  - wherein an effective impurity amount of an impurity of the second conductivity type forming the second semiconductor region is smaller in the second region than in the first region.

11. The photoelectric conversion element according to claim 9,
  - wherein the second semiconductor region includes
    - a third impurity region disposed in the first region and the second region and having a peak of an impurity density distribution at a third depth, and
    - a fourth impurity region disposed in the first region and having a peak of an impurity density distribution at a fourth depth closer to the first surface than the third depth.

12. The photoelectric conversion element according to claim 11, wherein an impurity amount per unit area in the second region of an impurity of the second conductivity type forming the second semiconductor region is equal to or less than 9⁄10 of an impurity amount per unit area in the first region of an impurity of the second conductivity type forming the second semiconductor region.

13. The photoelectric conversion element according to claim 1, further comprising:
  - a fifth semiconductor region of the second conductivity type disposed so as to surround in the plan view a region where the first semiconductor region, the second semiconductor region, and the third semiconductor region are disposed, and connected to the second semiconductor region at a peripheral edge portion of the second semiconductor region; and
  - a sixth semiconductor region of the second conductivity type disposed closer to the second surface than the third semiconductor region, overlapping the first semiconductor region, the second semiconductor region, and the third semiconductor region in the plan view, and connected to the fifth semiconductor region.

14. The photoelectric conversion element according to claim 13, further comprising: a first electrode connected to the first semiconductor region; and a second electrode connected to the fifth semiconductor region.

15. The photoelectric conversion element according to claim 1, further comprising an optical structure layer disposed on a side of the second surface of the semiconductor layer.

16. A photoelectric conversion device comprising:

a plurality of pixels arranged to form a plurality of rows and a plurality of columns, wherein each of the plurality of pixels including the photoelectric conversion element according to claim 1, and a signal processing circuit configured to process a signal output from the photoelectric conversion element.

17. The photoelectric conversion device according to claim 16, further comprising:

a first substrate including the semiconductor layer provided with the photoelectric conversion element of each of the plurality of pixels; and a second substrate provided with the signal processing circuit of each of the plurality of pixels.

18. The photoelectric conversion device according to claim 2, wherein the first semiconductor region has a circular shape in the plan view.

19. A photodetection system comprising:

a photoelectric conversion device according to claim 16; and a signal processing device configured to process a signal output from the photoelectric conversion device.

20. The photodetection system according to claim 19, wherein the signal processing device generates a distance image representing distance information to an object based on the signal.

21. A movable object comprising:

a photoelectric conversion device according to claim 16;

a distance information acquisition unit configured to acquire distance information to an object from a parallax image based on a signal output from the photoelectric conversion device; and a control unit configured to control the movable object based on the distance information.

* * * * *